United States Patent
Niki

(10) Patent No.: US 10,755,778 B1
(45) Date of Patent: Aug. 25, 2020

(54) SEMICONDUCTOR SWITCH AND SEMICONDUCTOR DEVICE

(71) Applicant: Toshiba Memory Corporation, Minato-ku (JP)

(72) Inventor: Yusuke Niki, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/507,077

(22) Filed: Jul. 10, 2019

(30) Foreign Application Priority Data

Mar. 19, 2019 (JP) .................. 2019-051998

(51) Int. Cl.
  *G11C 11/00* (2006.01)
  *G11C 13/00* (2006.01)
  *H01L 27/24* (2006.01)
  *H01L 45/00* (2006.01)
  *H03K 19/20* (2006.01)

(52) U.S. Cl.
  CPC ........ *G11C 13/003* (2013.01); *G11C 13/0011* (2013.01); *G11C 13/0023* (2013.01); *H01L 27/2481* (2013.01); *H01L 45/085* (2013.01); *H03K 19/20* (2013.01)

(58) Field of Classification Search
  CPC .................................. G11C 13/003
  USPC ....................................... 365/148
  See application file for complete search history.

(56) References Cited

U.S. PATENT DOCUMENTS

| | | | | |
|---|---|---|---|---|
| 7,145,818 B2* | 12/2006 | Fukuoka | ........ | G01R 31/318536 365/201 |
| 8,675,382 B2* | 3/2014 | Kurokawa | ........... | G11C 7/1006 365/63 |
| 9,208,830 B2* | 12/2015 | Niki | ......................... | G11O 5/14 |
| 2017/0077100 A1 | 3/2017 | Takahashi | | |
| 2018/0052508 A1 | 2/2018 | Okamoto et al. | | |
| 2018/0284823 A1 | 10/2018 | Na et al. | | |
| 2019/0052254 A1 | 2/2019 | Hess et al. | | |
| 2020/0091421 A1 | 3/2020 | Niki | | |

FOREIGN PATENT DOCUMENTS

JP 2017-55082 3/2017
JP 2020-47334 A 3/2020

OTHER PUBLICATIONS

U.S. Appl. No. 16/281,207, filed Feb. 21, 2019, Yusuke Niki.

* cited by examiner

*Primary Examiner* — Vu A Le

(74) *Attorney, Agent, or Firm* — Oblon, McClelland Maier & Neustadt, L.L.P.

(57) ABSTRACT

A semiconductor switch according to an embodiment includes: a first sub-switch and a second sub-switch. A first input signal is inputted into the first sub-switch and a second input signal is inputted into the second sub-switch. The first input signal is either a first voltage or a third voltage, the second input signal is either a second voltage or a fourth voltage, the second voltage is lower than the first voltage, the third voltage is lower than the first voltage and the fourth voltage is lower than the third voltage. The second voltage is inputted into the second sub-switch when an output from the first sub-switch is outputted from the semiconductor switch, and the third voltage is inputted into the first sub-switch when an output from the second sub-switch is outputted from the semiconductor switch.

14 Claims, 25 Drawing Sheets

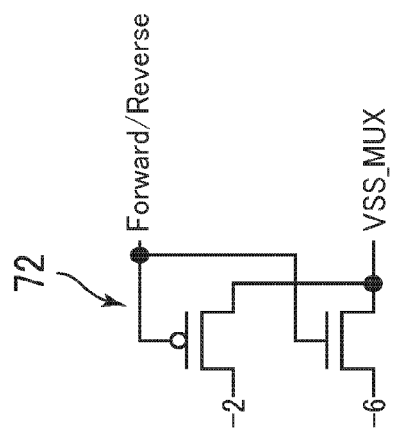
FIG. 23A • Well Switch
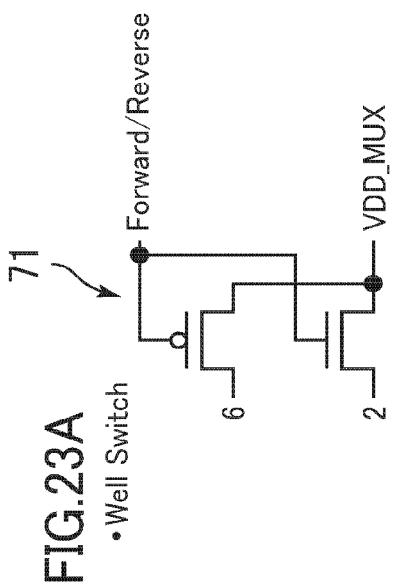
FIG. 23B • Input Switch
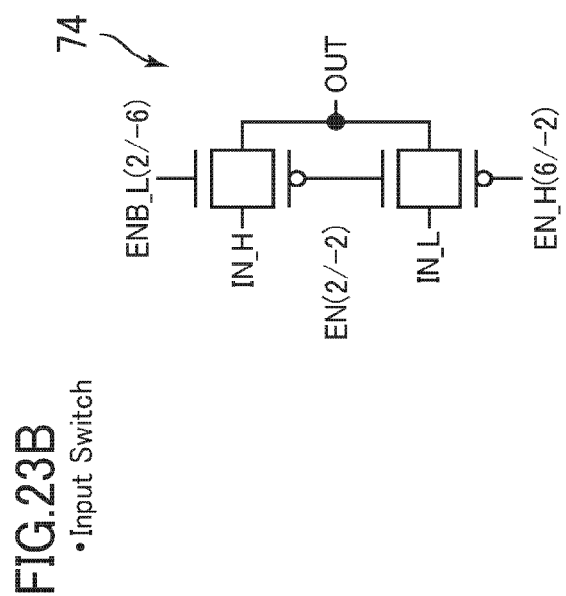
FIG. 23C • Output Switch

US 10,755,778 B1

SEMICONDUCTOR SWITCH AND SEMICONDUCTOR DEVICE

CROSS-REFERENCE TO RELATED APPLICATION

This application is based upon and claims the benefit of priority from Japanese Patent Application No. 2019-051998, filed on Mar. 19, 2019, the entire contents of which are incorporated herein by reference.

FIELD

Embodiments described herein relate generally to a semiconductor switch and a semiconductor device.

BACKGROUND

A cross-point memory device using a variable resistive element as a memory cell array has been attracting attention owing to a possibility to realize a large-capacity storage device more easily than conventional ones.

In the cross-point memory device, a large number of wires called bit lines and word lines are arranged crossing each other, and memory cells are formed at the intersections of the bit lines and the word lines. Write operation to a memory cell is performed by applying a voltage or a current to the bit line and the word line connected to the cell.

BRIEF DESCRIPTION OF THE DRAWINGS

FIGS. 23A to 23C are circuit diagrams of the respective switches used in the semiconductor device according to the third embodiment;

DETAILED DESCRIPTION

Figure 1:
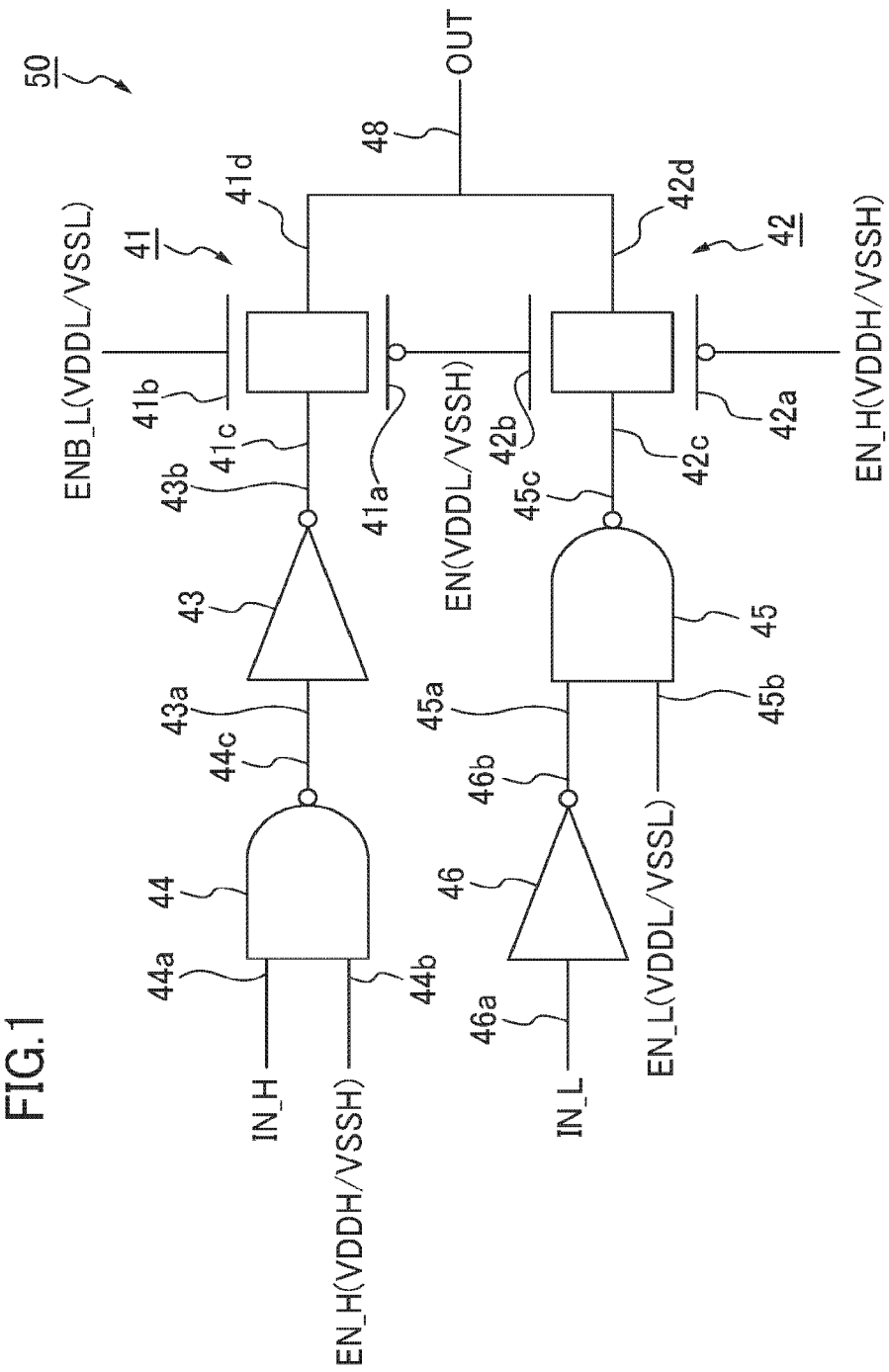
FIG. 1 is a circuit diagram of a semiconductor switch (semiconductor device) according to a first embodiment.

Hereinafter, embodiments will be described using the drawings. Note that the same or similar reference signs denote the same or similar parts in the drawings.

In this specification, in order to indicate the positional relationship between components and the like, the upward direction in the drawing is described as "upper," and the downward direction in the drawing is described as "lower". In this specification, the concepts of "upper" and "lower" are not necessarily terms indicating the relationship with the direction of gravity.

First Embodiment

A semiconductor switch (semiconductor device) according to this embodiment includes: a first sub-switch and a second sub-switch. A first input signal is inputted into the first sub-switch and a second input signal is inputted into the second sub-switch. The first input signal is either a first voltage or a third voltage, the second input signal is either a second voltage or a fourth voltage, the second voltage is lower than the first voltage, the third voltage is lower than the first voltage and the fourth voltage is lower than the third voltage. The second voltage is inputted into the second sub-switch when an output from the first sub-switch is outputted from the semiconductor switch, and the third voltage is inputted into the first sub-switch when an output from the second sub-switch is outputted from the semiconductor switch.

The semiconductor switch (semiconductor device) according this embodiment further includes: a first INV circuit whose output is connected to an input of the first sub-switch; a first NAND circuit whose output is connected to an input of the first INV circuit and which has one input and the other input; a second NAND circuit whose output is connected to an input of the second sub-switch and which has one input and the other input; and a second INV circuit whose output is connected to the one input of the second NAND circuit.

FIG. 1 is a circuit diagram of a semiconductor switch (semiconductor device) 50 according to this embodiment.

The semiconductor switch 50 includes a first sub-switch 41, a second sub-switch 42, a first INV circuit 43, a first NAND circuit 44, a second NAND circuit 45 and a second INV circuit 46.

The first sub-switch 41 has a first PMOS transistor 41*a* and a first NMOS transistor 41*b*. More specifically, the first sub-switch 41 is so called a transmission gate (transfer gate) at which the sources and the drains of the first PMOS transistor 41*a* and the first NMOS transistor 41*b* are connected to each other.

The second sub-switch 42 has a second PMOS transistor 42*a* and a second NMOS transistor 42*b*. More specifically, the second sub-switch 42 is so called a transmission gate (transfer gate) at which the sources and the drains of the second PMOS transistor 42*a* and the second NMOS transistor 42*b* are connected to each other.

As a third selection signal, VDDL (one example of a second voltage, for example, +2 V) or VSSL (one example of a fourth voltage, for example −6 V) is supplied to the gate of the first NMOS transistor 41*b*. Meanwhile, as the third selection signal, VDDH (one example of a first voltage, for example +6 V) or VSSH (one example of a third voltage, for example −2 V) is supplied to the gate of the second PMOS transistor 42*a*. Herein, the second voltage is lower than the first voltage, the third voltage is lower than the first voltage, and the fourth voltage is lower than the third voltage. Moreover, the second voltage is preferably higher than the third voltage.

An output 41*d* of the first sub-switch 41 and an output 42*d* of the second sub-switch 42 are connected to an output 48 of the semiconductor switch (semiconductor device) 50.

The gate of the first PMOS transistor 41*a* and the gate of the second NMOS transistor 42*b* are connected to each other. Then, VDDL or VSSH is supplied to the gate of the first PMOS transistor 41*a* and the gate of the second NMOS transistor 42*b*.

An output 43*b* of the first INV circuit 43 is connected to an input 41*c* of the first sub-switch 41.

An output 44*c* of the first NAND circuit 44 is connected to an input 43*a* of the first INV circuit 43. The first NAND circuit 44 has a first input (one input of the first NAND circuit 44) 44*a* of the first NAND circuit 44 and a second input (the other input of the first NAND circuit 44) 44*b* of the first NAND circuit 44. A first input signal (IN_H) is inputted into the first input 44*a* of the first NAND circuit 44. Herein, the first input signal (IN_H) is preferably, for example, the first voltage or the third voltage so that the circuit configuration is simplified. However, the first input signal (IN_H) is not limited to these.

The first voltage or the third voltage is inputted into the second input 44*b* of the first NAND circuit 44.

Herein, the opposite input signals may be inputted into the first input 44*a* and the second input 44*b* of the first NAND circuit 44, respectively. That is, for example, the first voltage or the third voltage may be inputted into the first input 44*a* of the first NAND circuit 44, and the first input signal (IN_H) may be inputted into the second input 44*b* of the first NAND circuit 44.

An output 45*c* of the second NAND circuit 45 is connected to an input 42*c* of the second sub-switch 42. An output 46*b* of the second INV circuit 46 is connected to a first input (one input of the second NAND circuit 45) 45*a* of the second NAND circuit 45. The second voltage or the fourth voltage is inputted into the second input (the other input of the second NAND circuit 45) 45*b* of the second NAND circuit 45.

A second input signal (IN_L) is inputted into an input 46*a* of the second INV circuit 46. Herein, the second input signal (IN_L) is preferably, for example, the second voltage or the fourth voltage so that the circuit configuration is simplified. However, the second input signal (IN_L) is not limited to these.

Herein, the opposite input signals may be inputted into the first input 45*a* and the second input 45*b* of the second NAND circuit 45, respectively. That is, for example, the second voltage or the fourth voltage may be inputted into the first input 45*a* of the second NAND circuit 45, and the output 46*b* of the second INV circuit 46 may be connected to the second input 45*b* of the second NAND circuit 45.

Moreover, in FIG. 1, "ENB_L (VDDL/VSSL)" is inputted into the gate of the first NMOS transistor 41*b*, and "EN_L (VDDL/VSSL)" is inputted into the second input 45*b* of the second NAND circuit 45. This means that the fourth voltage is inputted into the second input 45*b* of the second NAND circuit 45 when the second voltage is inputted into the gate of the first NMOS transistor 41*b*, and the second voltage is inputted into the second input 45*b* of the second NAND circuit 45 when the fourth voltage is inputted into the gate of the first NMOS transistor 41*b*. The same applies to the meanings of the "EN" and "ENB" in a different context.

Figure 2:
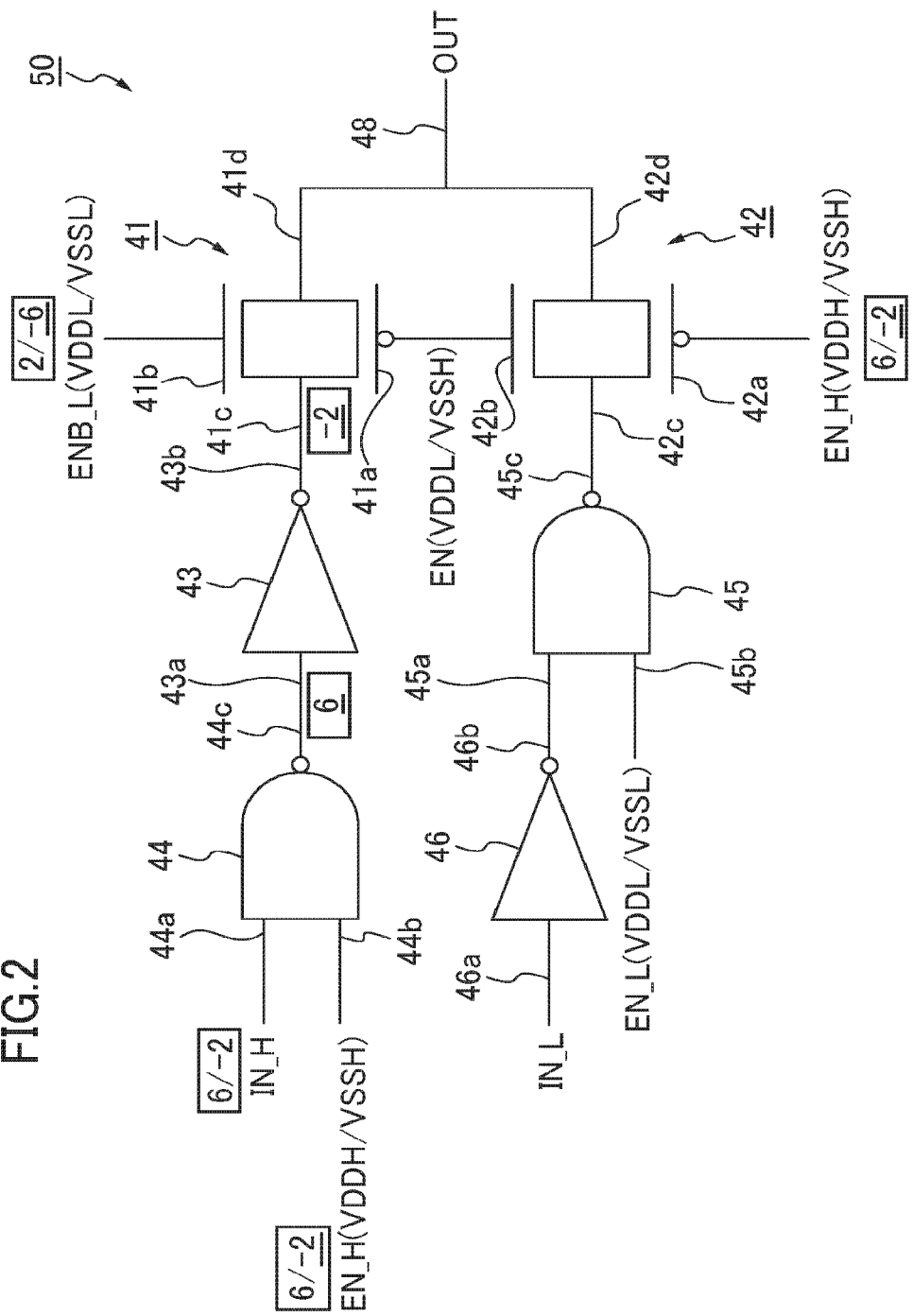
FIG. 2 is one example of the operation in the circuit diagram of the semiconductor switch (semiconductor device) according to the first embodiment.
Figure 3:
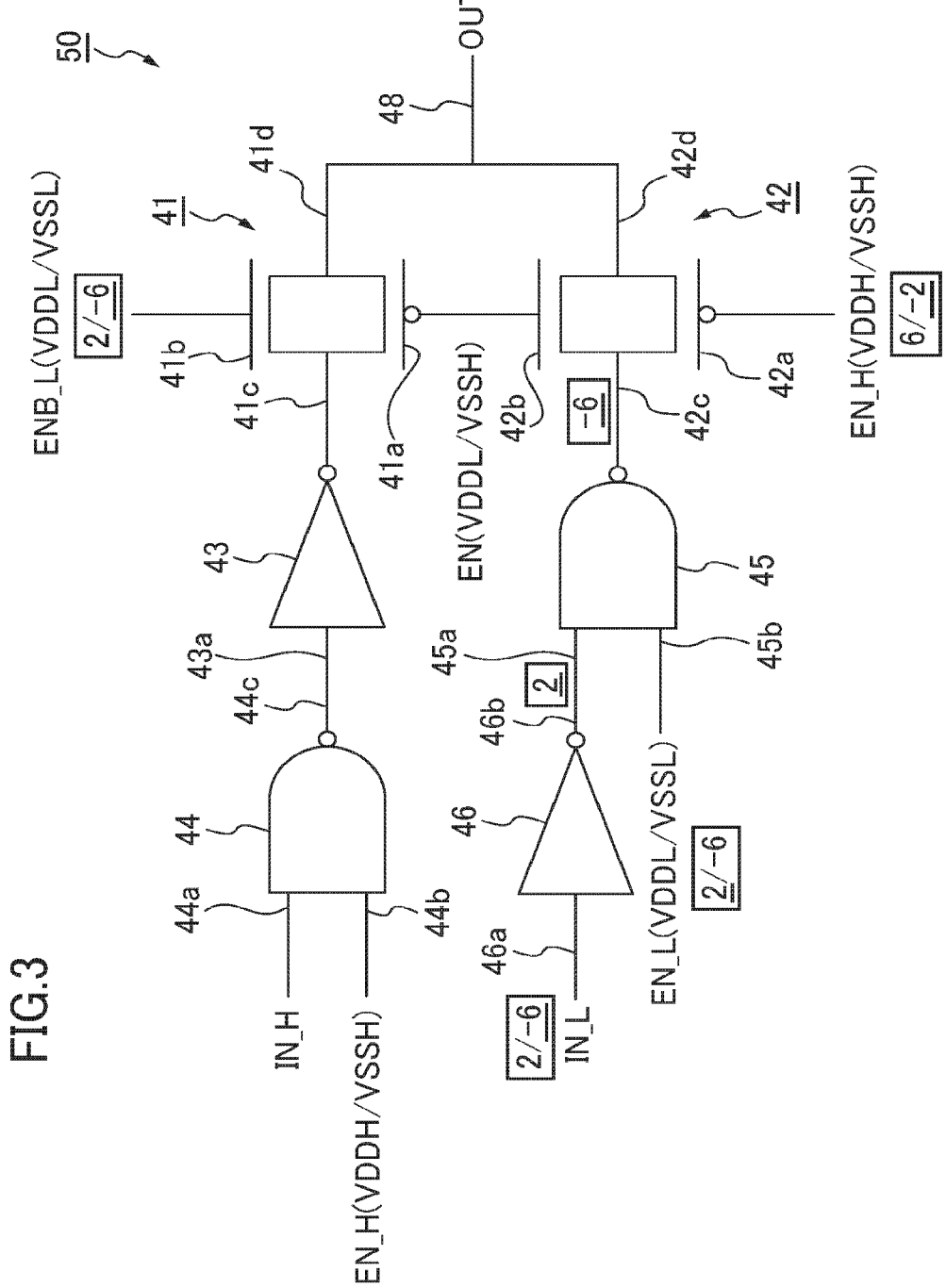
FIG. 3 is one example of the operation in the circuit diagram of the semiconductor switch (semiconductor device) according to the first embodiment.

FIGS. 2 and 3 are one example of the operation in the circuit diagram of the semiconductor switch (semiconductor device) 50 according to this embodiment. In FIGS. 2 and 3, a signal outputted by the output 42*d* of the second sub-switch 42 is used as the output 48 of the semiconductor switch 50. That is, the first NMOS transistor 41*b* and the first PMOS transistor 41*a* are turned off, and the second NMOS transistor 42*b* and the second PMOS transistor 42*a* are turned on. The fourth voltage (−6 V) is inputted into the gate of the first NMOS transistor 41*b*. Then, the third voltage (−2 V) is inputted into the gate of the second PMOS transistor 42*a*. VDDL (+2 V, the second voltage) is inputted into the gate of the first PMOS transistor 41*a* and the gate of the second NMOS transistor 42*b*. Moreover, in this case, the third voltage (−2 V) is preferably inputted into the input 41*c* of the first sub-switch 41. To this end, the third voltage (−2 V) is inputted into the second input 44*b* of the first NAND circuit 44. In this case, regardless of whether the first input signal (IN_H) is either the first voltage (+6 V) or the third voltage (−2 V), the output from the first NAND circuit 44 is the first voltage (+6 V) with a logical value of 1. Therefore, the third voltage (−2 V) with a logical value of 0 is outputted by the first INV circuit 43. As a result, the third voltage (−2 V) is inputted into the input 41*c* of the first sub-switch 41.

FIG. 3 shows the operation on the second sub-switch 42 side. The second voltage (+2 V) is inputted into the second input 45*b* of the second NAND circuit 45. Moreover, the second voltage (+2 V) or the fourth voltage (−6 V) is inputted into the input 46*a* of the second INV circuit 46. As a result, the second voltage (+2 V) or the fourth voltage (−6 V) is inputted into the input 42*c* of the second sub-switch 42.

In other words, the first input signal is inputted into the one input 44*a* of the first NAND circuit 44, the third voltage is inputted into the other input 44*b* of the first NAND circuit 44, the fourth voltage selected from the second input signal is inputted into the input 46*a* of the second INV circuit 46, the second voltage is inputted into the other input 45*b* of the second NAND circuit 45, the second voltage is inputted into the gate of the first PMOS transistor 41a and the gate of the second NMOS transistor 42b, the first voltage or the third voltage, which is the first selection signal, and the fourth voltage selected from the second voltage or the fourth voltage are inputted into the gate of the first NMOS transistor 41b, the third voltage selected from the first selection signal is inputted into the gate of the second PMOS transistor 42a, and the output from the second sub-switch 42 is outputted from the semiconductor switch 50. As a result, the semiconductor switch 50 selects one of the first input signal or the second input signal.

In the aspects in FIGS. 2 and 3, the voltage difference between the gate of the first NMOS transistor 41b and the input 41c of the first sub-switch 41 is (−6 V)−(−2 V)=−4 V, and the voltage difference between the gate of the first PMOS transistor 41a and the input 41c of the first sub-switch 41 is (+2 V)−(−2 V)=4 V. Moreover, when the fourth voltage (−6 V) is inputted into the input 42c of the second sub-switch 42, the potential difference between the gate of the second NMOS transistor 42b and the input 42c of the second sub-switch 42 is (+2 V)−(−6 V)=+8 V. Furthermore, the potential difference between the gate of the second PMOS transistor 42a and the input 42c of the second sub-switch 42 is (−2 V)−(−6 V)=4 V.

Figure 4:
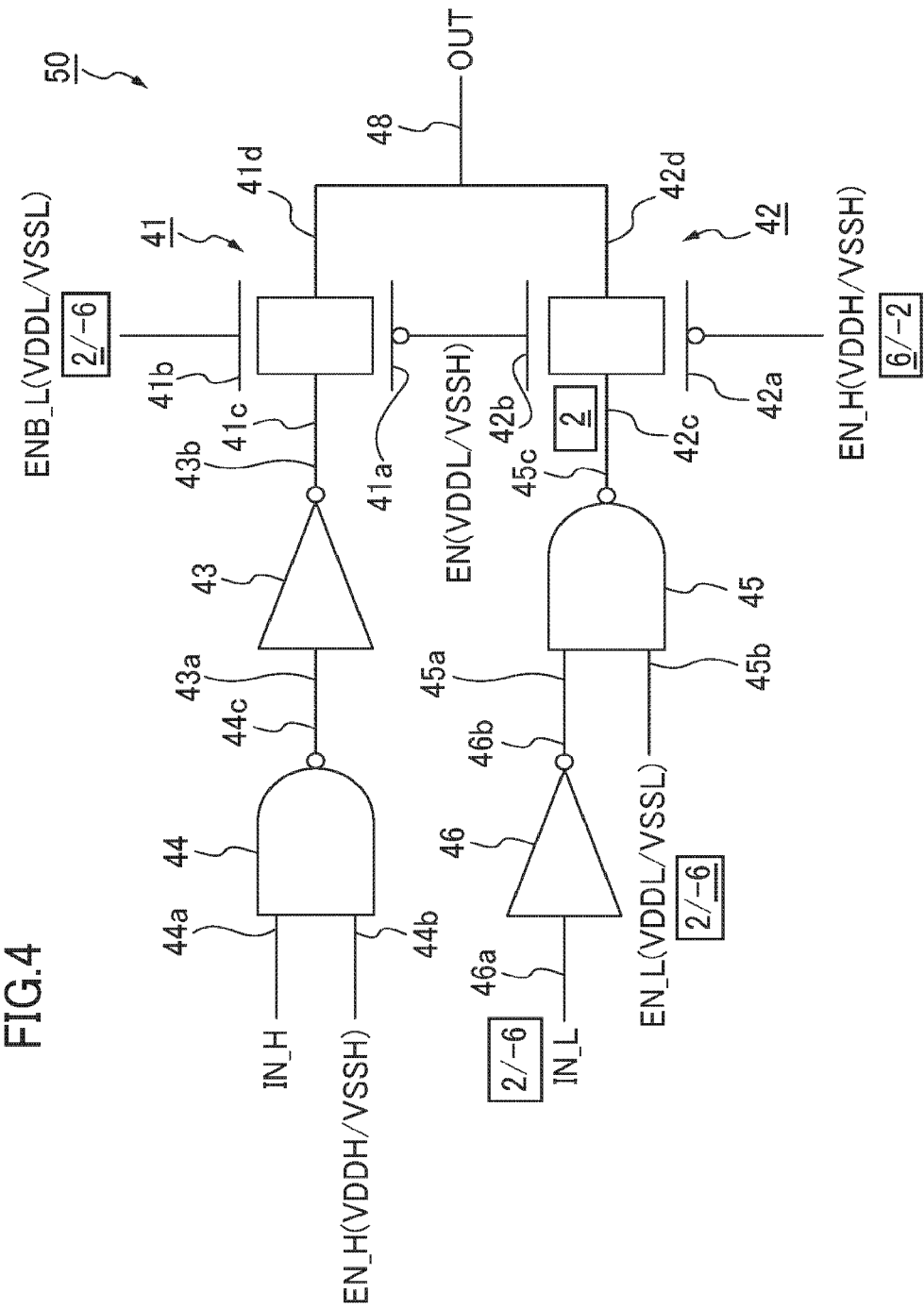
FIG. 4 is another example of the operation in the circuit diagram of the semiconductor switch (semiconductor device) according to the first embodiment.
Figure 5:
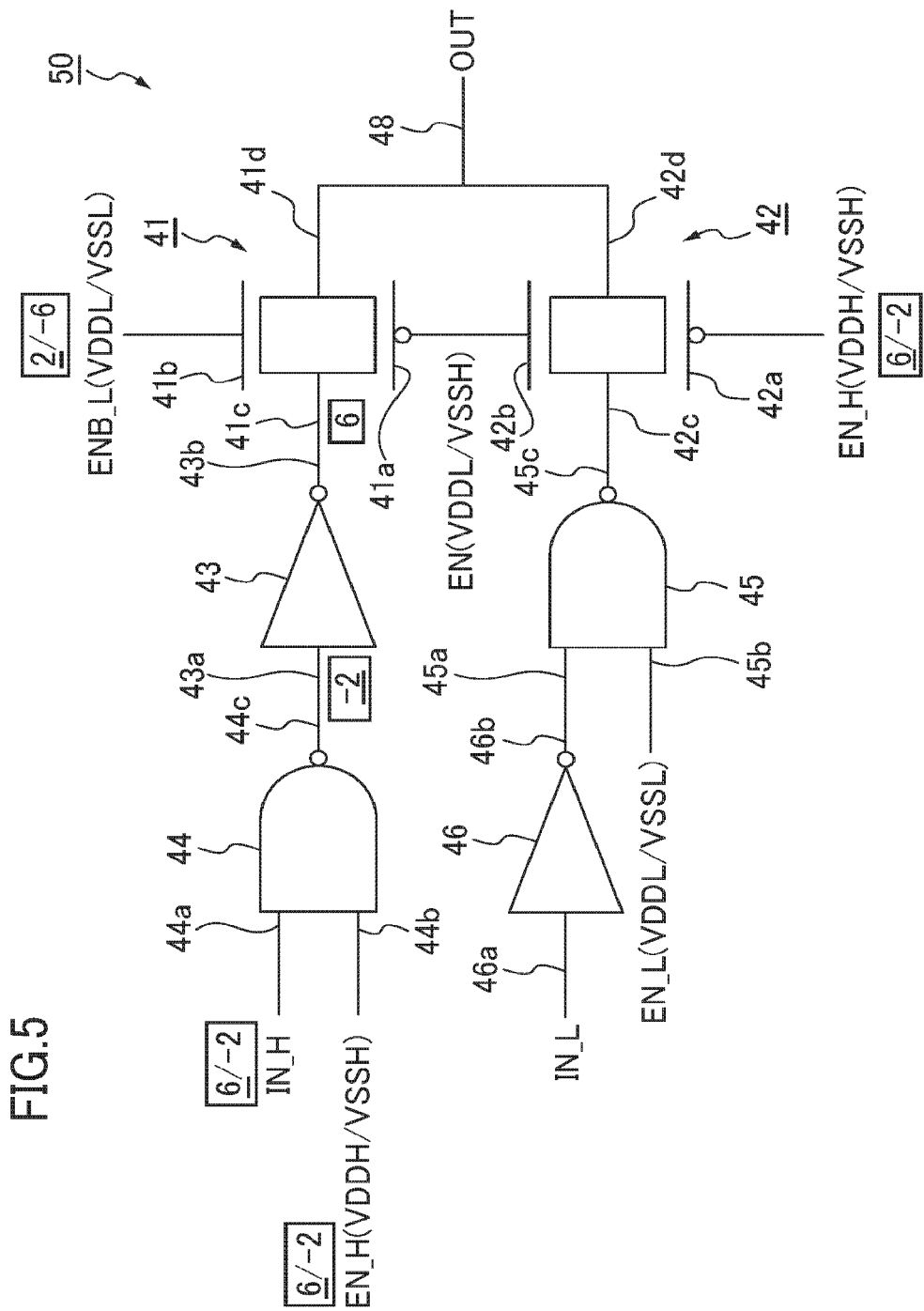
FIG. 5 is another example of the operation in the circuit diagram of the semiconductor switch (semiconductor device) according to the first embodiment.

FIGS. 4 and 5 are another example of the operation in the circuit diagram of the semiconductor switch (semiconductor device) 50 according to this embodiment. Herein, unlike the case in FIGS. 2 and 3, a signal outputted by the output 41d of the first sub-switch 41 is used as the output 48 of the semiconductor switch 50. That is, the first NMOS transistor 41b and the first PMOS transistor 41a are turned on, and the second NMOS transistor 42b and the second PMOS transistor 42a are turned off. The second voltage (+2 V) is inputted into the gate of the first NMOS transistor 41b. Then, the first voltage (+6 V) is inputted into the gate of the second PMOS transistor 42a. Moreover, in this case, the fourth voltage (−6 V) is inputted into the second input 45b of the second NAND circuit 45. Furthermore, VSSH (−2 V, the third voltage) is inputted into the gate of the first PMOS transistor 41a and the gate of the second NMOS transistor 42b. In this case, regardless of whether the second input signal (IN_L) is either the second voltage (+2 V) or the fourth voltage (−6 V), the output from the second NAND circuit 45 is the second voltage (+2 V) with a logical value of 1. As a result, the second voltage (+2 V) is inputted into the input 42c of the second sub-switch 42. Note that FIG. 5 shows the operation on the first sub-switch 41 side.

In other words, the first voltage selected from the first input signal is inputted into the one input 44a of the first NAND circuit 44, the first voltage is inputted into the other input 44b of the first NAND circuit 44, the second input signal is inputted into the input 46a of the second INV circuit 46, the fourth voltage is inputted into the other input 45b of the second NAND circuit 45, the third voltage is inputted into the gate of the first PMOS transistor 41a and the gate of the second NMOS transistor 42b, the first voltage or the third voltage, which is the first selection signal, and the second voltage selected from the second voltage or the fourth voltage are inputted into the gate of the first NMOS transistor 41b, the first voltage selected from the first selection signal is inputted into the gate of the second PMOS transistor 42a, and the output from the first sub-switch 41 is outputted from the semiconductor switch 50. As a result, the semiconductor switch 50 selects one of the first input signal or the second input signal.

In the aspects in FIGS. 4 and 5, when the first voltage (+6 V) is inputted into the input 41c of the first sub-switch 41, the voltage difference between the gate of the first NMOS transistor 41b and the input 41c of the first sub-switch 41 is (+2 V)−(+6 V)=−4 V, and the voltage difference between the gate of the first PMOS transistor 41a and the input 41c of the first sub-switch 41 is (−2 V)−(+6 V)=−8 V. Moreover, the potential difference between the gate of the second NMOS transistor 42b and the input 42c of the second sub-switch 42 is (−2 V)−(+2 V)=−4 V. Furthermore, the potential difference between the gate of the second PMOS transistor 42a and the input 42c of the second sub-switch 42 is (+6 V)−(+2 V)=4 V.

Next, the effects of this embodiment will be described.

It is desirable that the difference between the voltages applied between the respective electrodes of the transistors used in the first sub-switch 41 and the second sub-switch 42 be not high in order to protect the transistors used in the sub-switches.

In the semiconductor switch (semiconductor device) 50, when the difference between the first voltage (+6 V) and the fourth voltage (−6 V) is applied to the transistors, the maximum voltage difference of 12 V in absolute value may be possibly applied. However, as described above, such an event does not occur in the semiconductor switch (semiconductor device) 50, and the maximum voltage difference is 8 V in absolute value. That is, the maximum applied voltage applied to the transistors is reduced.

Connecting the gate of the first PMOS transistor 41a and the gate of the second NMOS transistor 42b to each other does not cause a problem.

The second voltage is preferably higher than the third voltage to connect the gate of the first PMOS transistor 41a and the gate of the second NMOS transistor 42b.

According to the semiconductor switch (semiconductor device) of this embodiment, it is possible to provide a semiconductor switch (semiconductor device) in which the maximum applied voltage is reduced.

Second Embodiment

A semiconductor switch (semiconductor device) according to this embodiment includes: a first sub-switch and a second sub-switch. A first input signal is inputted into the first sub-switch and a second input signal is inputted into the second sub-switch. The first input signal is either a first voltage or a third voltage, the second input signal is either a second voltage or a fourth voltage, the second voltage is lower than the first voltage, the third voltage is lower than the first voltage and the fourth voltage is lower than the third voltage. The second voltage is inputted into the second sub-switch when an output from the first sub-switch is outputted from the semiconductor switch, and the third voltage is inputted into the first sub-switch when an output from the second sub-switch is outputted from the semiconductor switch.

The semiconductor switch (semiconductor device) according to this embodiment further includes: a first NOR circuit whose output is connected to an input of the first sub-switch; a third INV circuit whose output is connected to a first input of the first NOR circuit; a fourth INV circuit whose output is connected to an input of the second sub-switch; and a second NOR circuit whose output is connected to an input of the fourth INV circuit.

Herein, the description of the contents overlapping the first embodiment will be omitted.

Figure 6:
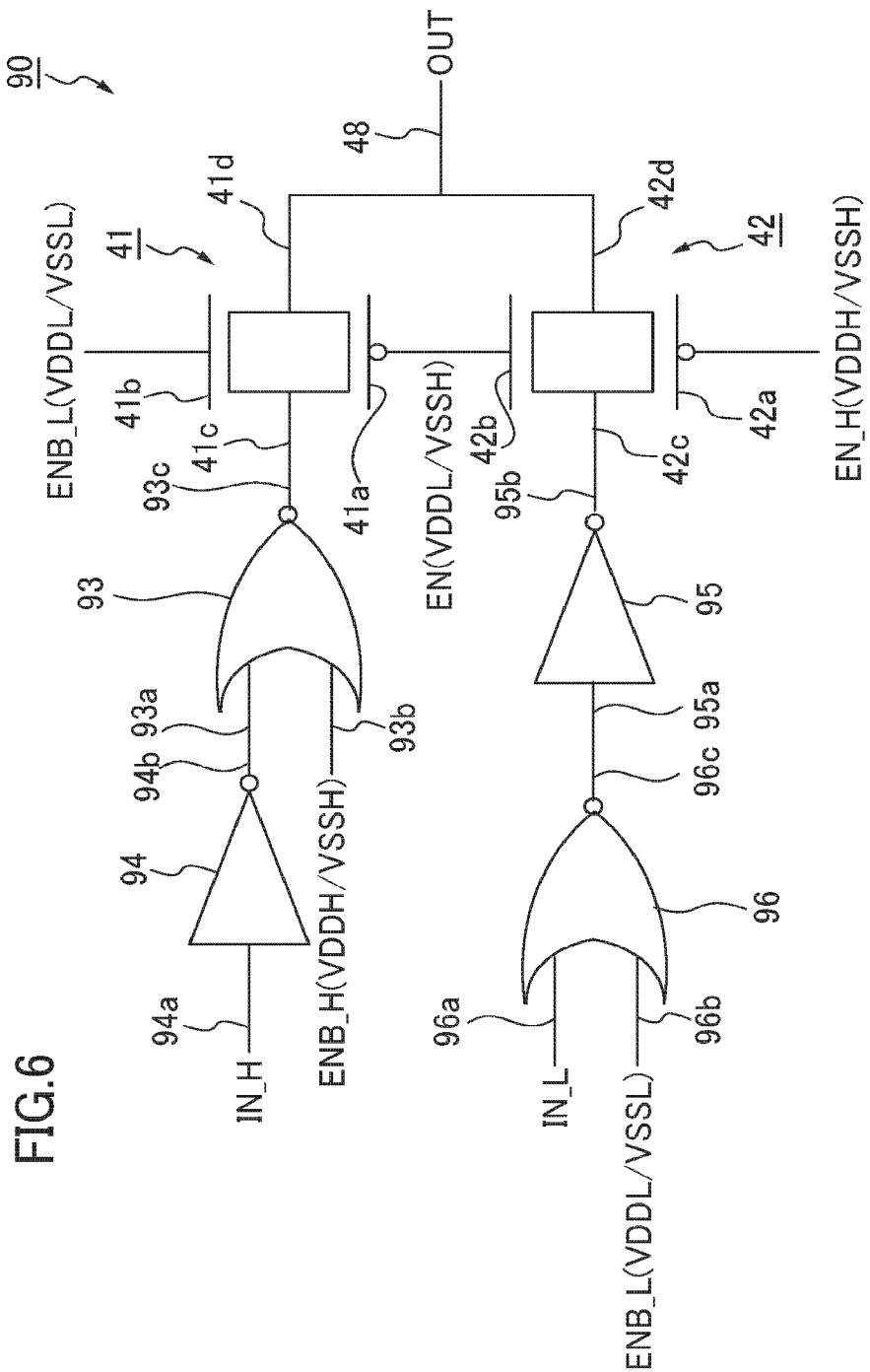
FIG. 6 is a circuit diagram of a semiconductor switch (semiconductor device) according to a second embodiment.

FIG. 6 is a circuit diagram of a semiconductor switch (semiconductor device) 90 according to this embodiment.

The semiconductor switch 90 includes a first sub-switch 41, a second sub-switch 42, a first NOR circuit 93, a third INV circuit 94, a fourth INV circuit 95 and a second NOR circuit 96.

An output 93c of the first NOR circuit 93 is connected to an input 41c of the first sub-switch 41.

An output 94b of the third INV circuit 94 is connected to a first input (one input of the first NOR circuit 93) 93a of the first NOR circuit 93. A first input signal (IN_H) is inputted into an input 94a of the third INV circuit 94.

The first voltage or the third voltage is inputted into a second input (the other input of the first NOR circuit 93) 93b of the first NOR circuit 93. Herein, in FIG. 6, "EN_H (VDDH/VSSH)" is inputted into the gate of a second PMOS transistor 42a, and "ENB_H (VDDH/VSSH)" is inputted into the second input 93b of the first NOR circuit 93. This means that the first voltage is inputted into the second input 93b of the first NOR circuit 93 when the third voltage is inputted into the gate of the second PMOS transistor 42a, and the third voltage is inputted into the second input 93b of the first NOR circuit 93 when the first voltage is inputted into the gate of the second PMOS transistor 42a. The same applies to the meanings of the "EN" and "ENB" in a different context.

Herein, the opposite input signals may be inputted into the first input 93a and the second input 93b of the first NOR circuit 93, respectively. That is, for example, the first voltage or the third voltage may be inputted into the first input 93a of the first NOR circuit 93, and the output 94b of the third INV circuit 94 may be connected to the second input 93b of the first NOR circuit 93.

An output 95b of the fourth INV circuit 95 is connected to an input 42c of the second sub-switch 42. An output 96c of the second NOR circuit 96 is connected to an input 95a of the fourth INV circuit 95. A second input signal (IN_L) is inputted into a first input 96a (one input of the second NOR circuit 96) of the second NOR circuit 96. Herein, the second input signal (IN_L) is preferably, for example, the second voltage or the fourth voltage so that the circuit configuration is simplified. However, the second input signal (IN_L) is not limited to these.

The second voltage or the fourth voltage is inputted into a second input (the other input of the second NOR circuit 96) 96b of the second NOR circuit 96. The voltage inputted into the second input (the other input of the second NOR circuit 96) 96b of the second NOR circuit 96 is the same as the voltage inputted into the gate of a first NMOS transistor 41b.

Herein, the opposite input signals may be inputted into the first input 96a and the second input 96b of the second NOR circuit 96, respectively.

Figure 7:
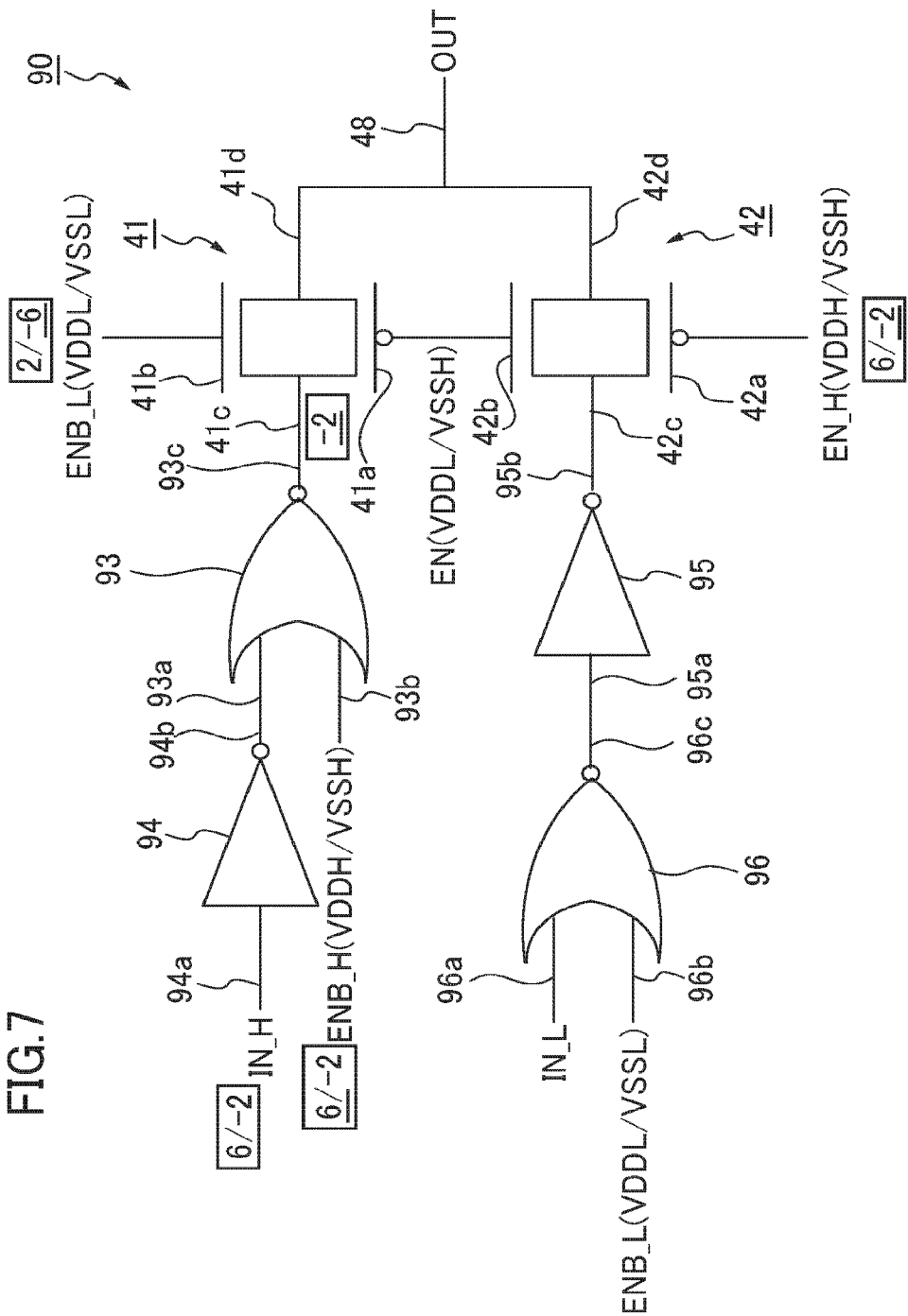
FIG. 7 is one example of the operation in the circuit diagram of the semiconductor switch (semiconductor device) according to the second embodiment.
Figure 8:
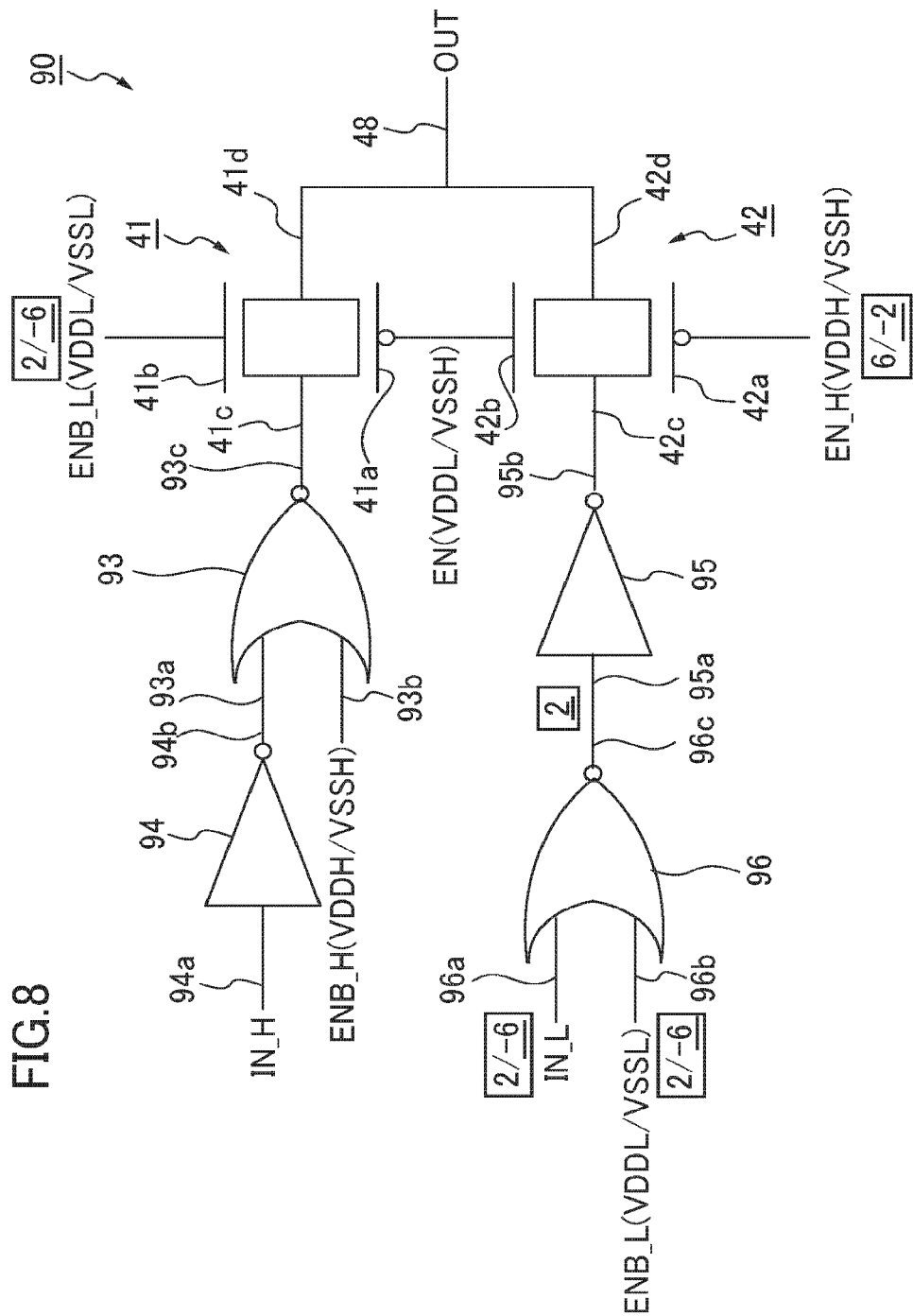
FIG. 8 is one example of the operation in the circuit diagram of the semiconductor switch (semiconductor device) according to the second embodiment.

FIGS. 7 and 8 are one example of the operation in the circuit diagram of the semiconductor switch (semiconductor device) 90 according to this embodiment. In FIG. 7, a signal outputted by an output 42d of the second sub-switch 42 is used as an output 48 of the semiconductor switch 90. In this case, the third voltage (−2 V) is preferably inputted into the input 41c of the first sub-switch 41. To this end, the first voltage (+6 V) is inputted into the second input 93b (one input of the first NOR circuit 93) of the first NOR circuit 93. Moreover, VDDL (+2 V, the second voltage) is inputted into the gate of the first PMOS transistor 41a and the gate of the second NMOS transistor 42b. In this case, regardless of whether the first input signal (IN_H) is either the first voltage (+6 V) or the third voltage (−2 V), the output from the first NOR circuit 93 is the third voltage (−2 V) with a logical value of 0.

FIG. 8 shows the operation on the second sub-switch 42 side. The fourth voltage (−6 V) is inputted into the second input 96b. Therefore, when the fourth voltage (−6 V) is inputted into the first input 96a of the second NOR circuit 96, the second voltage (+2 V) is inputted into the input 95a of the fourth INV circuit 95. As a result, the fourth voltage (−6 V) is inputted into the input 42c of the second sub-switch 42.

In other words, the first input signal is inputted into the input 94a of the third INV circuit 94, the first voltage is inputted into the other input 93b of the first NOR circuit 93, the fourth voltage selected from the second input signal is inputted into the one input 96a of the second NOR circuit 96, the fourth voltage is inputted into the other input 96b of the second NOR circuit 96, the second voltage is inputted into the gate of the first PMOS transistor 41a and the gate of the second NMOS transistor 42b, the first voltage or the third voltage, which is the first selection signal, and the fourth voltage selected from the second voltage or the fourth voltage are inputted into the gate of the first NMOS transistor 41b, the third voltage selected from the first selection signal is inputted into the gate of the second PMOS transistor 42a, and the output from the second sub-switch 42 is outputted from the semiconductor switch 90. As a result, the semiconductor switch 90 selects one of the first input signal or the second input signal.

In the aspects in FIGS. 7 and 8, the voltage difference between the gate of the first NMOS transistor 41b and the input 41c of the first sub-switch 41 is (−6 V)−(−2 V)=−4 V, and the voltage difference between the gate of the first PMOS transistor 41a and the input 41c of the first sub-switch 41 is (+2 V)−(−2 V)=+4 V. Moreover, when the fourth voltage (−6 V) is inputted into the first input 96a of the second NOR circuit 96, the potential difference between the gate of the second NMOS transistor 42b and the input 42c of the second sub-switch 42 is (+2 V)−(−6 V)=+8 V. Furthermore, the potential difference between the gate of the second PMOS transistor 42a and the input 42c of the second sub-switch 42 is (−2 V)−(−6 V)=+4 V.

Figure 9:
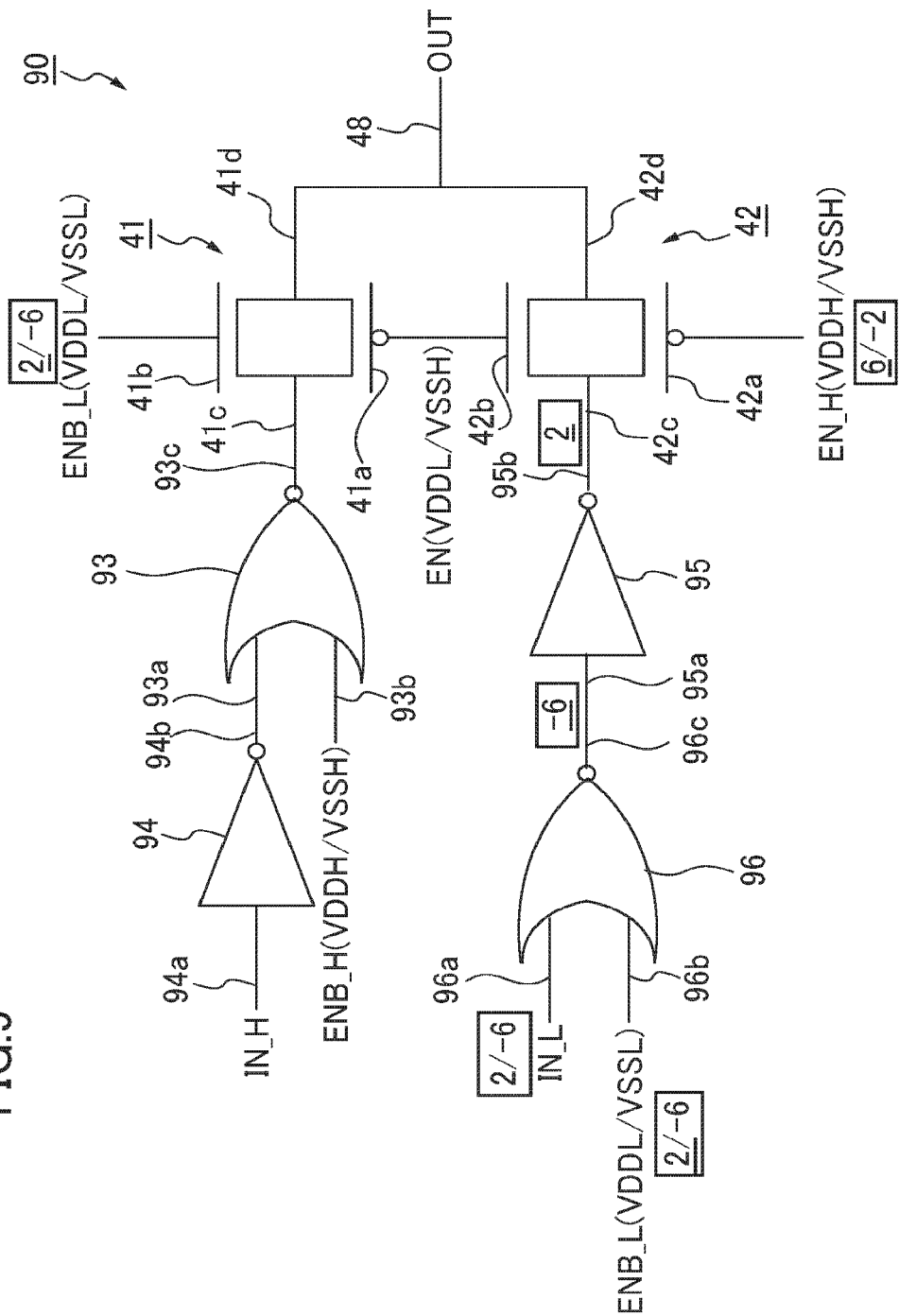
FIG. 9 is another example of the operation in the circuit diagram of the semiconductor switch (semiconductor device) according to the second embodiment.
Figure 10:
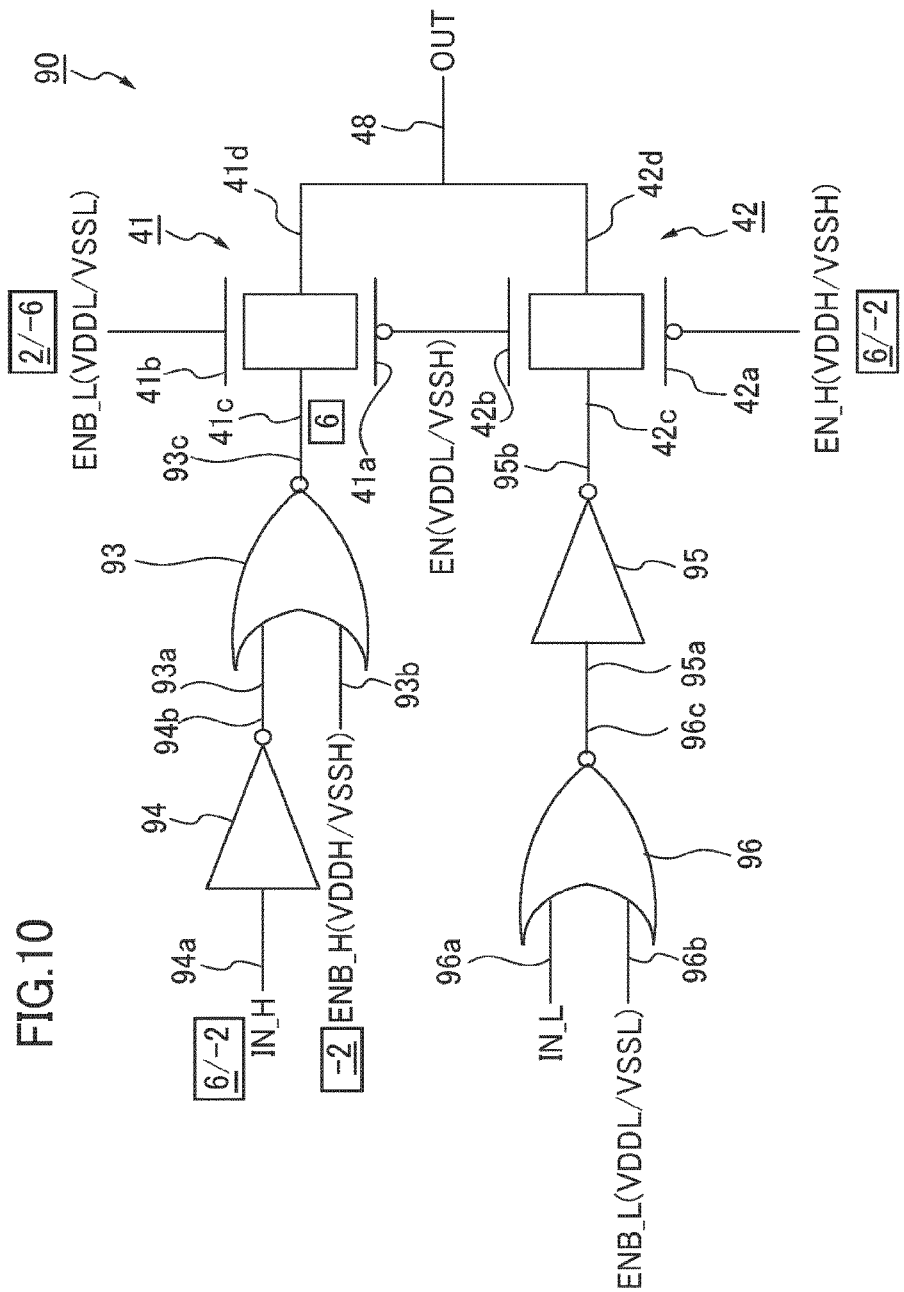
FIG. 10 is another example of the operation in the circuit diagram of the semiconductor switch (semiconductor device) according to the second embodiment.

FIGS. 9 and 10 are another example of the operation in the circuit diagram of the semiconductor switch (semiconductor device) 90 according to this embodiment. In FIGS. 9 and 10, unlike the case in FIGS. 7 and 8, a signal outputted by the output 41d of the first sub-switch 41 is used as the output 48 of the semiconductor switch 90. In FIG. 9, since the second voltage (+2 V), which is the same voltage applied to the gate of the first NMOS transistor 41b, is inputted into the second input 96b of the second NOR circuit 96, the fourth voltage (−6 V) is inputted into the input 95a of the fourth INV circuit 95. As a result, the second voltage (+2 V) is outputted to the output 95b of the fourth INV circuit 95.

FIG. 10 similarly shows the operation on the first sub-switch 41 side.

In other words, the first voltage selected from the first input signal is inputted into the input 94a of the third INV circuit 94, the third voltage is inputted into the other input 93b of the first NOR circuit 93, the second input signal is inputted into the one input 96a of the second NOR circuit 96, the second voltage is inputted into the other input 96b of the second NOR circuit 96, the third voltage is inputted into the gate of the first PMOS transistor 41a and the gate of the second NMOS transistor 42b, the first voltage or the third voltage, which is the first selection signal, and the second voltage selected from the second voltage or the fourth voltage are inputted into the gate of the first NMOS transistor 41b, the first voltage selected from the first selection signal is inputted into the gate of the second PMOS transistor 42a, and the output from the first sub-switch 41 is outputted from the semiconductor switch 90. As a result, the semiconductor switch 90 selects one of the first input signal or the second input signal.

In the aspect in FIGS. 9 and 10, when the first voltage is inputted into the input 94a of the third INV circuit 94, the voltage between the gate of the first NMOS transistor 41b and the input 41c of the first sub-switch 41 is (+2 V)−(+6 V)=−4 V, and the voltage difference between the gate of the first PMOS transistor 41a and the input 41c of the first sub-switch 41 is (−2 V)−(+6 V)=−8 V. Moreover, the potential difference between the gate of the second NMOS transistor 42b and the input 42c of the second sub-switch 42 is (−2 V)−(+2 V)=−4 V. Furthermore, the potential difference between the gate of the second PMOS transistor 42a and the input 42c of the second sub-switch 42 is (+6 V)−(+2 V)=4 V.

Next, the effects of this embodiment will be described.

The maximum voltage difference is 8 V in absolute value also in the semiconductor switch (semiconductor device) 90. That is, as in the first embodiment, the maximum applied voltage applied to the transistors is reduced.

According to the semiconductor switch (semiconductor device) of this embodiment, it is possible to provide a semiconductor switch (semiconductor device) in which the maximum applied voltage is reduced.

Third Embodiment

A semiconductor device according to this embodiment includes: a first switch configured to use a second selection signal and a third selection signal to select one of a first voltage and a third voltage or a second voltage and a fourth voltage; a semiconductor switch according to the first embodiment or the second embodiment configured to select one of a first input signal or a second input signal; a second switch configured to output the third voltage when the first voltage and the third voltage are selected by the first switch and the first input signal, which is the first voltage, is selected by the semiconductor switch, to output the first voltage when the first voltage and the third voltage are selected by the first switch and the first input signal, which is the third voltage, is selected by the semiconductor switch, to output the second voltage when the second voltage and the fourth voltage are selected by the first switch and the second input signal, which is the second voltage, is selected by the semiconductor switch, and to output the fourth voltage when the second voltage and the fourth voltage are selected by the first switch and the second input signal, which is the fourth voltage, is selected by the semiconductor switch; a third switch configured to output the first voltage when the third voltage is outputted from the second switch, to output the third voltage when the first voltage is outputted from the second switch, to output the fourth voltage when the second voltage is outputted from the second switch, and to output the second voltage when the fourth voltage is outputted from the second switch; and a control circuit configured to control the first switch, the semiconductor switch, the second switch and the third switch.

The semiconductor device according to this embodiment is a semiconductor device using the semiconductor switch according to the first or second embodiment. Herein, the description of the contents overlapping the first and second embodiments will be omitted.

Figure 11:
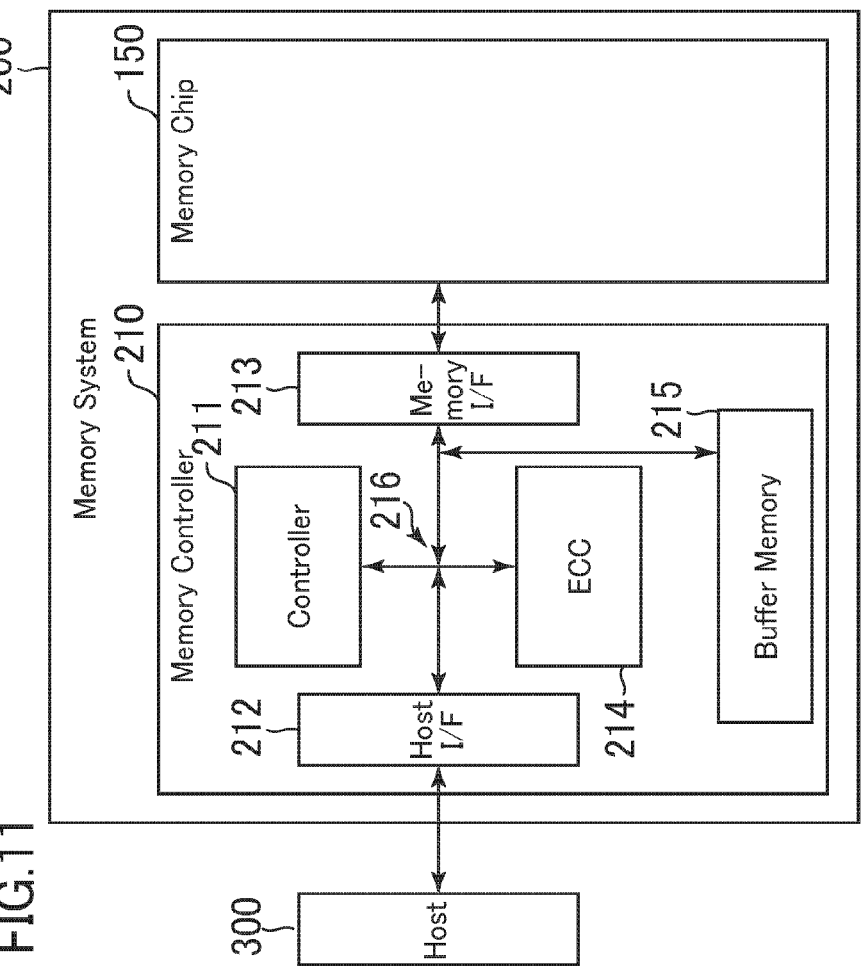
FIG. 11 is a block diagram showing the configuration of a memory system according to a third embodiment.

FIG. 11 is a block diagram showing the configuration of a memory system 200 according to this embodiment. The memory system 200 is communicably connected to a host 300 and functions as an external storage device for the host 300. The host 300 is, for example, a server, a personal computer, a mobile information processing device, and so forth.

The memory system 200 has a memory chip 150 and a memory controller 210. The memory controller 210 controls the memory chip 150 in response to a request from the host 300 or autonomously.

The memory controller 210 has a control unit 211, a host interface (I/F) 212, a memory interface (I/F) 213, an error correction circuit (ECC) 214, a buffer memory 215 and a bus 216. The control unit 211, the host I/F 212, the memory I/F 213, the ECC 214, and the buffer memory 215 are communicably connected to each other via the bus 216. The control unit 211 is, for example, a central processing unit (CPU) and integrally controls each unit in the memory controller 210. The host I/F 212 mediates the communication with the host 300. The memory I/F 213 mediates the transmission of data and instructions to and from the memory chip 150. The ECC 214 performs error correction processing on the data read out from the memory chip 150. The buffer memory 215 buffers the data and instructions transmitted to and from the memory chip 150. The buffer memory 215 is also used as a work area of the control unit 211.

Figure 12:
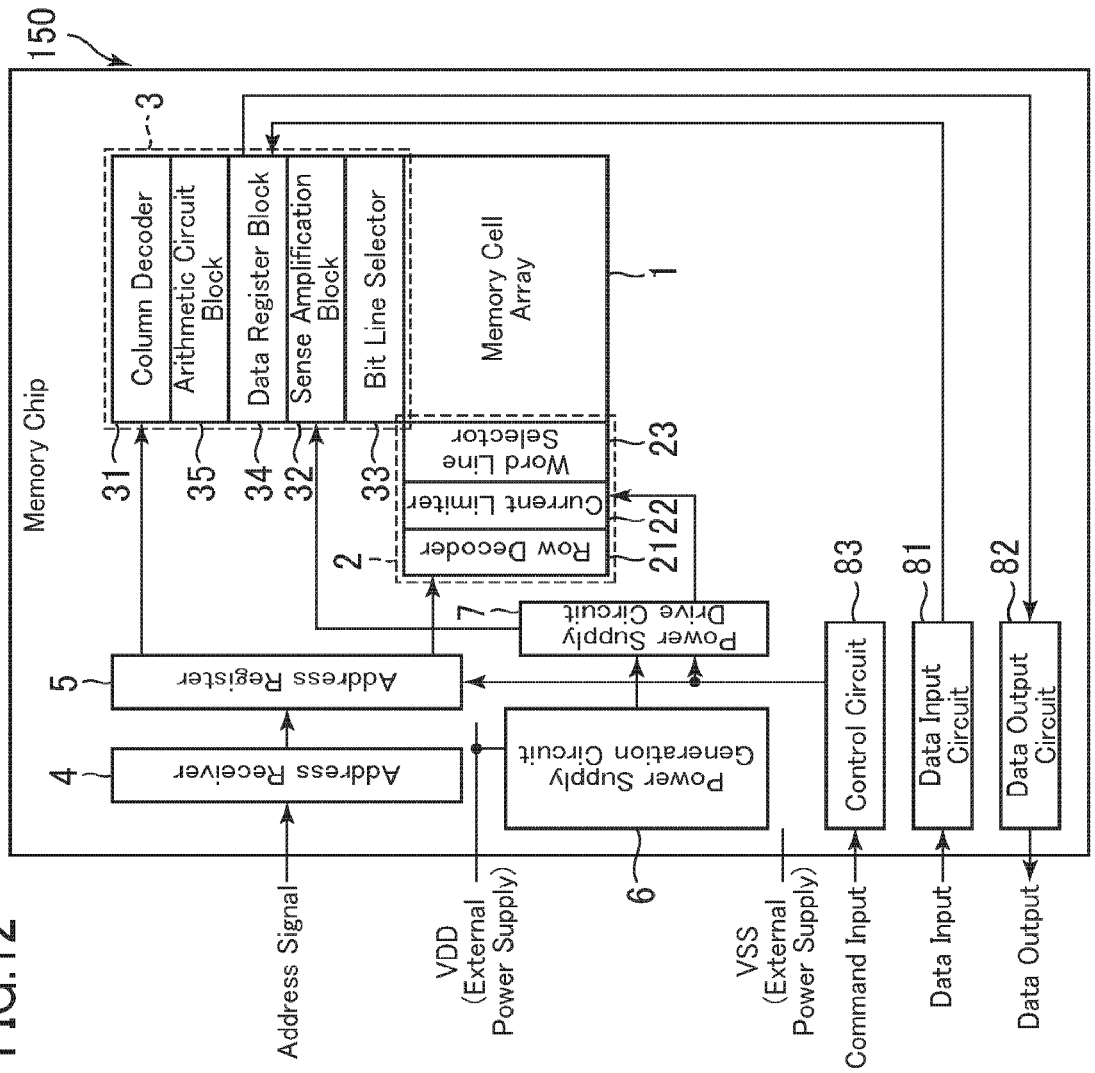
FIG. 12 is a block diagram showing the configuration of the memory chip according to the third embodiment.

FIG. 12 is a block diagram showing the configuration of the memory chip 150 according to this embodiment.

The memory chip 150 has a memory cell array 1, a Row circuit 2, a Column circuit 3, an address receiver 4, an address register 5, a power supply generation circuit 6, a power supply drive circuit 7, a control circuit 83, a data input circuit 81, and a data output circuit 82.

Figure 13:
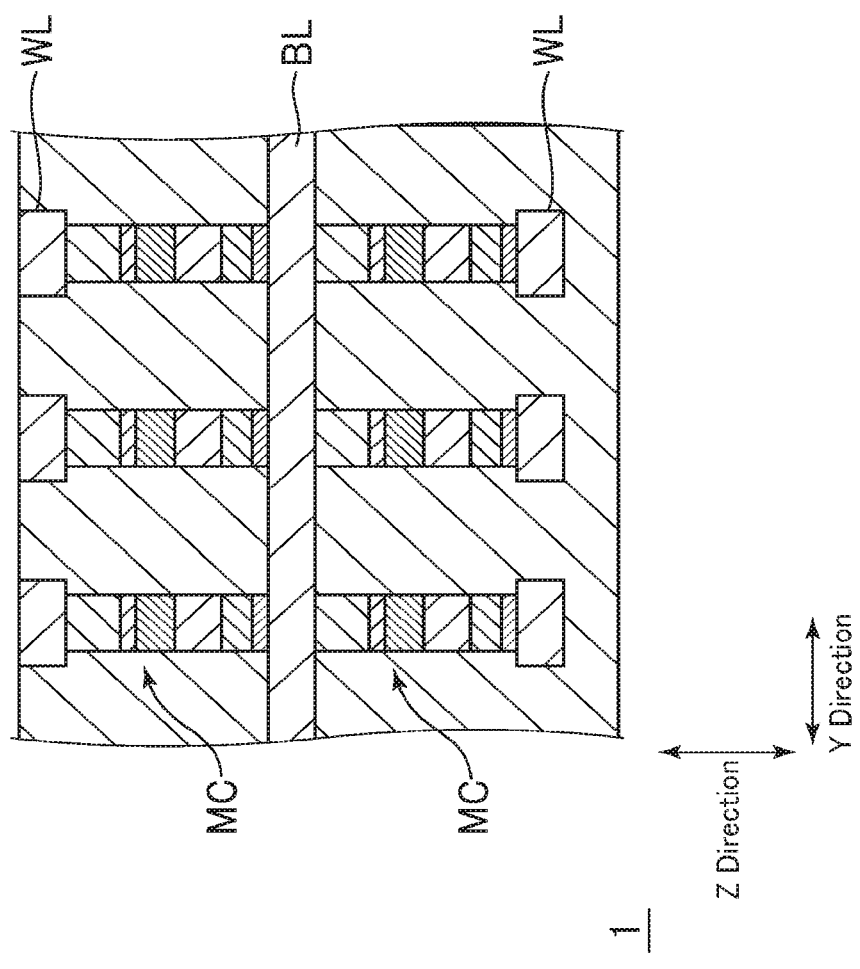
FIG. 13 is a schematic sectional view of the memory cell array according to the third embodiment.
Figure 14:
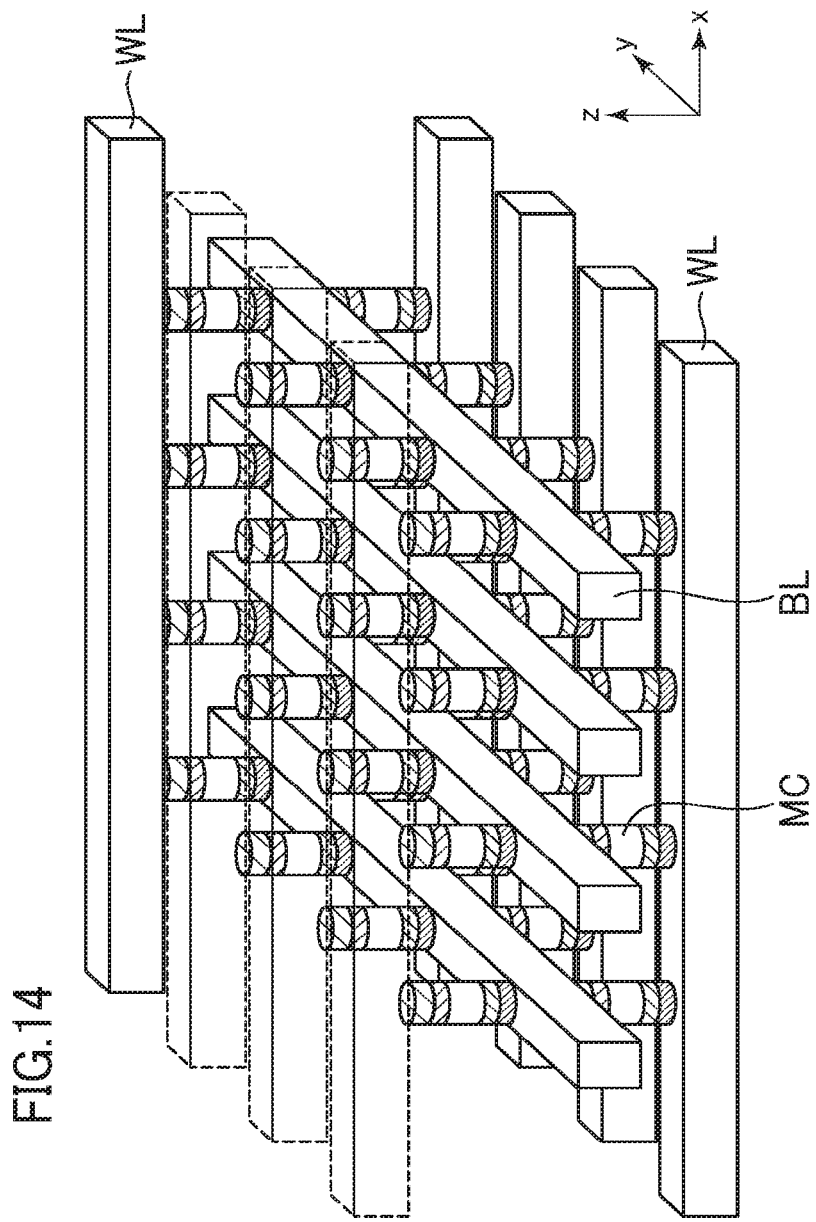
FIG. 14 is a schematic perspective view of the memory cell array according to the third embodiment.

FIG. 13 is a schematic sectional view of the memory cell array 1 according to this embodiment. FIG. 14 is a schematic perspective view of the memory cell array 1 according to this embodiment.

The memory cell array 1 is a cross-point memory device having variable resistive memory cells MC. The memory cell array 1 is, for example, formed on a silicon substrate (not shown) via an interlayer insulation film (not shown).

Word lines WL and bit lines BL are made of, for example, tungsten. The word lines WL and the bit lines BL are alternately placed at predetermined intervals in the vertical direction (Z direction). The word lines WL extend, for example, in the X direction. Each of the word lines WL is placed at a predetermined interval in the Y direction. The bit lines BL extend, for example, in the Y direction. Each of the bit lines BL is placed at a predetermined interval in the X direction. As shown in FIG. 14, the word lines WL and the bit lines BL are placed in the directions crossing each other.

The memory cells MC are formed at the respective intersections of the word lines WL and the bit lines BL adjacent in the Z direction. FIG. 13 shows an example in which three memory cells MC are formed between the bit line BL at the center of FIG. 13 and the word lines WL provided above and under the bit line BL three by three.

Note that the number of memory cell MC layers, the number of word lines WL and the number of bit lines BL are not limited to those described above.

Figures 15A, 15B:
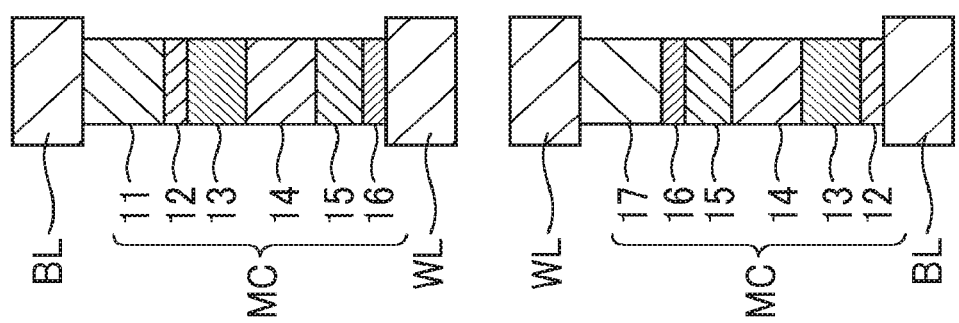
FIGS. 15A and 15B are schematic sectional views of the memory cell according to the third embodiment.

FIGS. 15A and 15B are schematic sectional views of the memory cell MC according to the embodiment. The memory cell MC is a nonvolatile variable resistive memory cell, for example, a conductive bridging random access memory (CBRAM). FIG. 15A is a schematic sectional view showing the cross-section structure of the memory cell MC formed between the bit line BL and the word line WL placed under the bit line BL. FIG. 15B is a schematic sectional view showing the cross-section structure of the memory cell MC formed between the bit line BL and the word line WL placed above the bit line BL.

The memory cell MC in FIG. 15A has a structure in which a bit line contact metal layer 11, a barrier metal layer 12, an ion source electrode 13, an ion diffusion layer 14, a counter electrode 15, and a barrier metal layer 16 are stacked between the bit line BL and the word line WL in order from the bit line BL.

The memory cell MC in FIG. 15B has a structure in which a word line contact metal layer 17, the barrier metal layer 16, the counter electrode 15, the ion diffusion layer 14, the ion source electrode 13, and the barrier metal layer 12 are stacked between the bit line BL and the word line WL in order from the word line WL.

The ion source electrode 13 contains, for example, a metallic element such as copper (Cu), silver (Ag), aluminum (Al), cobalt (Co), or nickel (Ni).

The ion diffusion layer 14 has a structure which enables electrodiffusion of the ionized metallic element at the ion source electrode 13. The ion diffusion layer 14 includes, for example, amorphous silicon, a silicon oxide film, a silicon nitride film, or transition metal oxide.

In the initial state of the memory cell MC, the metal ions are not moved from the ion source electrode 13 to the ion diffusion layer 14 so that there is a high resistive state (OFF) between the ion source electrode 13 and the counter electrode 15.

Next, a set voltage (writing voltage), which is a relatively high voltage, is applied between the ion source electrode 13 and the counter electrode 15. That is, a positive voltage is applied to the ion source electrode 13, and a negative voltage is applied to the counter electrode 15. At this time, the metal ions are moved from the ion source electrode 13 to the ion diffusion layer 14. Accordingly, there is a low resistive state (ON) where the resistance between the ion source electrode 13 and the counter electrode 15 is lowered.

On the other hand, when a relatively high voltage (reset voltage) in the direction opposite to the set voltage is applied, the metal ions are moved in the opposite direction, and the state returns to the original high resistive state (OFF).

Moreover, when a relatively low voltage in the direction opposite to the set voltage is applied in the above low resistive state, the metal ions are moved toward the ion source electrode 13, and the state becomes the high resistive state (OFF). Herein, when a voltage is applied in the same direction as the set direction, the metal ions are moved toward the counter electrode 15, and the state returns to the low resistive state (ON).

Thus, the memory cell MC functions as a switching element having rectification property. Furthermore, in a case where an n-type semiconductor is used for the counter electrode 15, a portion of the counter electrode 15 in contact with the ion diffusion layer 14 is depleted in a state where a voltage is applied opposite to the set direction. Therefore, strong rectification property is obtained.

Figure 16:
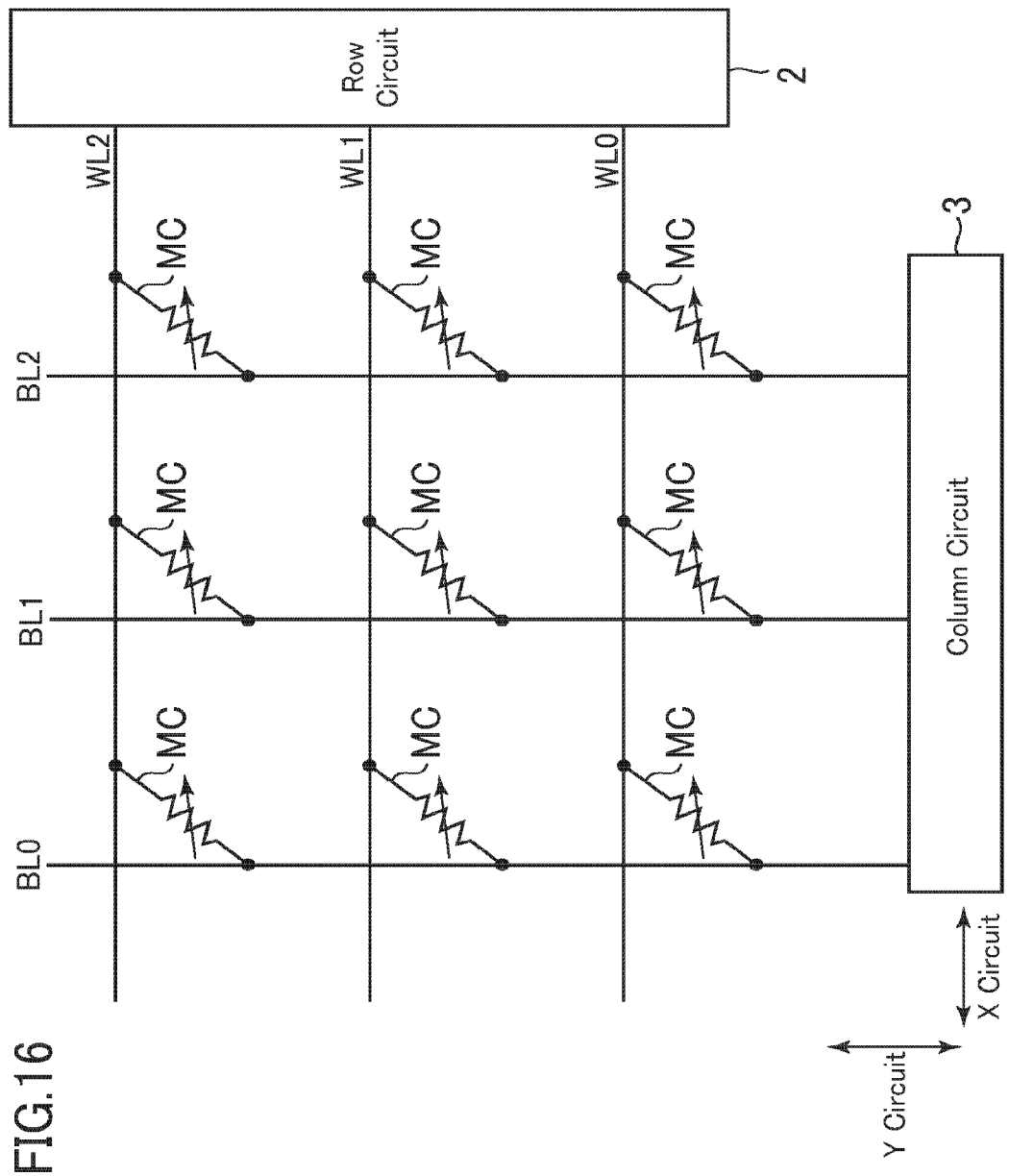
FIG. 16 is a circuit diagram of a main part of the memory cell according to the third embodiment.

FIG. 16 is a circuit diagram of a main part of the memory cell according to the embodiment.

The word lines WL are connected to the Row circuit 2, and the bit lines BL are connected to the Column circuit 3. Then, the memory cells MC are formed at the respective intersections of the word lines WL and the bit lines BL.

Figure 17:
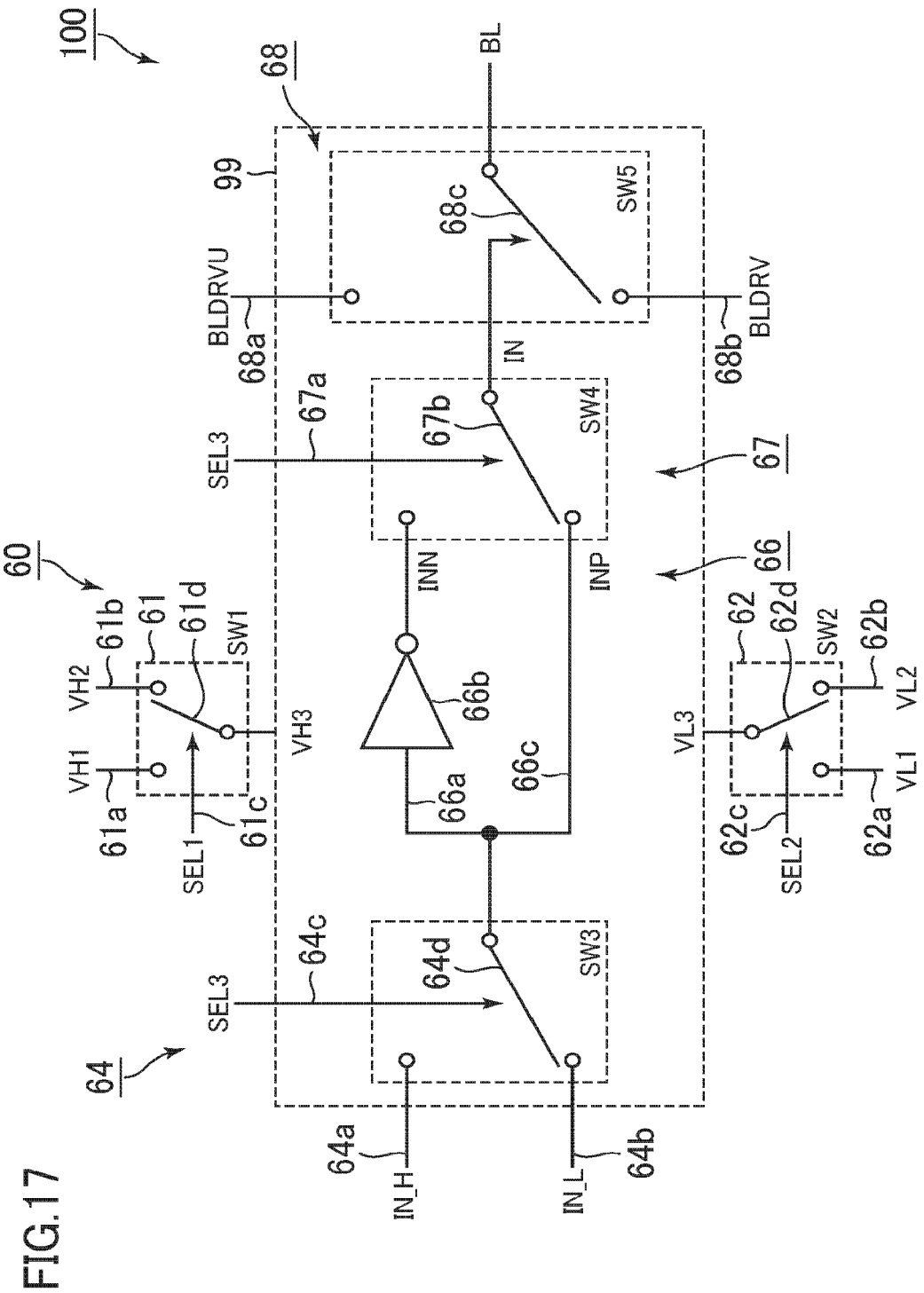
FIG. 17 is a circuit diagram of a semiconductor device of one aspect of the third embodiment.

FIG. 17 is a circuit diagram of a semiconductor device 100 of one aspect of this embodiment.

For example, the semiconductor device 100 corresponds to a column decoder 31 and a bit line selector 33 in FIG. 12, and FIG. 17 shows an example in which a voltage is supplied to the bit line BL by using the semiconductor device 100.

The semiconductor device 100 has a Well switch (one example of a first switch) 60 and an operation circuit 99. The operation circuit 99 includes an Input switch (semiconductor switch) 64, a NOT part 66, an Output switch (one example of a second switch) 67 and a multiplexer (one example of a third switch) 68.

The Well switch 60 has a first Well switch unit 61 and a second Well switch unit 62. The first Well switch unit 61 has a first voltage supply line 61a, a second voltage supply line 61b, a first selection signal supply line 61c, and a switch 61d for the first Well switch. The second Well switch unit 62 has a third voltage supply line 62a, a fourth voltage supply line 62b, a second selection signal supply line 62c, and a switch 62d for the second Well switch.

Using a first selection signal (SEL1) and a second selection signal (SEL2), the Well switch 60 selects one of a first voltage and a third voltage or a second voltage and a fourth voltage. Note that the second voltage is lower than the first voltage, and the fourth voltage is lower than the third voltage. As one example, the first Well switch unit 61 and the second Well switch unit 62 operate as follows.

Using the first selection signal (SEL1) supplied from the first selection signal supply line 61c, the first Well switch unit (SW1) 61 selects the first voltage (VH1) or the second voltage (VH2) by the switch 61d for the first Well switch. The first voltage (VH1) is supplied from the first voltage supply line 61a, and the second voltage (VH2) is supplied from the second voltage supply line 61b. The first selection signal (SEL1) is used to control the switch 61d for the first Well switch.

Using the second selection signal (SEL2) supplied from the second selection signal supply line 62c, the second Well switch unit (SW2) 62 selects the third voltage (VL1) or the fourth voltage (VL2) by the switch 62d for the second Well switch. The third voltage (VL1) is supplied from the third voltage supply line 62a, and the fourth voltage (VL2) is supplied from the fourth voltage supply line 62b. The second selection signal (SEL2) is used to control the switch 62d for the second Well switch.

The Well switch 60 is, in other words, a switch for supplying power to operate the operation circuit 99.

The Input switch 64 has a first input signal supply line 64a, a second input signal supply line 64b, a third selection signal supply line 64c and a switch 64d for the Input switch.

Using a third selection signal (SEL3) supplied from the third selection signal supply line 64c, the Input switch 64 selects a first input signal (IN_H) or a second input signal (IN_L) by the switch 64d for the Input switch (SW3). The first input signal (IN_H) is supplied from the first input signal supply line 64a, and the second input signal (IN_L) is supplied from the second input signal supply line 64b. The third selection signal (SEL3) is used to control the switch 64d for the Input switch.

The first input signal (IN_H) is preferably, for example, the first voltage or the third voltage so that additional separation of the power supply domains is unnecessary and the circuit configuration is simplified. Moreover, the second input signal (IN_L) is preferably, for example, the second voltage or the fourth voltage so that additional separation of the power supply domains is unnecessary and the circuit configuration is simplified. However, the first input signal (IN_H) and the second input signal (IN_L) are not limited as described above.

Note that, specifically, the semiconductor switch 50 according to the first embodiment is preferably used as the Input switch 64. In this case, the first input signal supply line 64*a* is connected to the first input (one input of the first NAND circuit 44) 44*a* of the first NAND circuit 44 of the semiconductor switch 50. Moreover, the second input signal supply line 64*b* is connected to the input 46*a* of the second INV circuit 46 of the semiconductor switch 50. Then, the output 48 of the semiconductor switch 50 is connected to a first NOT part wire 66*a* and a second NOT part wire 66*c*, which will be described later. Note that the first input signal supply line 64*a* may be connected to the second input 44*b* of the first NAND circuit 44 of the semiconductor switch 50.

In addition, the semiconductor switch 90 according to the second embodiment is also preferably used as the Input switch 64. In this case, the first input signal supply line 64*a* is connected to the input 94*a* of the third INV circuit 94 of the semiconductor switch 90. Moreover, the second input signal supply line 64*b* is connected to the first input 96*a* (one input of the second NOR circuit 96) of the second NOR circuit 96 of the semiconductor switch 90. Then, the output 48 of the semiconductor switch 90 is connected to a first NOT part wire 66*a* and a second NOT part wire 66*c*, which will be described later. Note that the second input signal supply line 64*b* may be connected to the second input 96*b* of the second NOR circuit 96.

The NOT part 66 has the first NOT part wire 66*a*, a fifth INV circuit 66*b* and the second NOT part wire 66*c*.

The first NOT part wire 66*a* and the second NOT part wire 66*c* are connected to the switch 64*d* for the Input switch. Accordingly, the first input signal (IN_H) or the second input signal (IN_L) is supplied to the first NOT part wire 66*a* and the second NOT part wire 66*c*. Since the fifth INV circuit 66*b* is connected to the first NOT part wire 66*a*, the logical value of the first input signal (IN_H) or the second input signal (IN_L) is reversed and outputted to the portion indicated by "INN" in FIG. 17. On the other hand, since an INV circuit is not connected to the second NOT part wire 66*c*, the logical value of the first input signal or the second input signal is outputted directly to a portion indicated by "INP" in FIG. 17.

The Output switch 67 has a fourth selection signal supply line 67*a* and a switch 67*b* for the Output switch (SW4).

The fourth selection signal supply line 67*a* supplies the third selection signal (SEL3). Then, using the third selection signal (SEL3), either the signal outputted to "INN" or the signal outputted to "INP" is selected by the switch 67*b* for the Output switch.

The multiplexer 68 is a switch having a role of, for example, selecting a BLDRV line 68*b* described on the lower side of the drawing of FIG. 17 in a case where a signal with the logical value of "1" is supplied, and selecting a BLDRVU line 68*a* described on the upper side of the drawing of FIG. 17 in a case where a signal with the logical value of "0" is supplied. The signal supplied to the BLDRVU line 68*a* or the BLDRV line 68*b*, which is selected by the multiplexer 68 as appropriate, is supplied to the bit line BL.

FIGS. 18 to 21 are examples of the operation of the semiconductor device 100 of one aspect of the embodiment.

Figure 18:
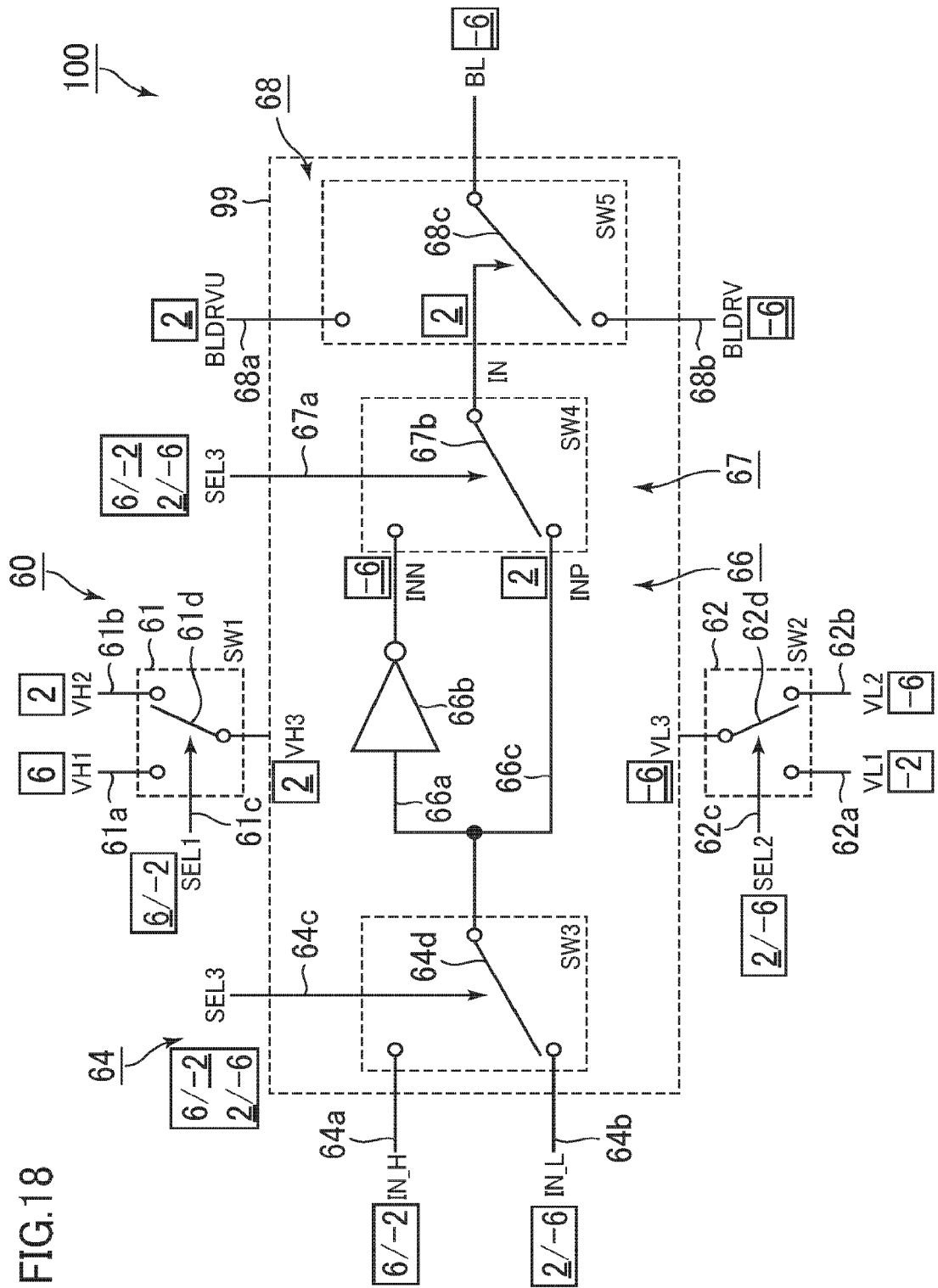
FIG. 18 is one example of the operation in the circuit diagram of the semiconductor device of one aspect of the third embodiment.

Description is made using FIG. 18. The first selection signal (SEL1) is +6 V or −2 V. In FIG. 18, +6 V is selected as the first selection signal (SEL1). Therefore, a signal of +6 V is supplied by the first selection signal supply line 61*c*.

By the signal of +6 V supplied from the first selection signal supply line 61*c*, the switch 61*d* for the first Well switch selects VH2 (the second voltage, +2 V) from VH1 (the first voltage, +6 V) and VH2 (the second voltage, +2 V). Accordingly, a signal of +2 V is supplied as one operating voltage (VH3) of the operation circuit 99.

The first selection signal (SEL1) is preferably equal to the first voltage or the third voltage so that the circuit configuration is simplified.

The second selection signal (SEL2) is +2 V or −6 V. In FIG. 18, +2 V is selected as the second selection signal (SEL2). The signal of +2 V is supplied by the second selection signal supply line 62*c*.

By the signal of +2 V supplied from the second selection signal supply line 62*c*, the switch 62*d* for the second Well switch selects VL2 (the fourth voltage, −6 V) from VL1 (the third voltage, −2 V) and VL2 (the fourth voltage, −6 V). Accordingly, a signal of −6 V is supplied as one operating voltage (VL3) of the operation circuit 99.

The second selection signal (SEL2) is preferably equal to the second voltage or the fourth voltage so that the circuit configuration is simplified.

The first input signal supply line 64*a* supplies the first voltage (+6 V) or the third voltage (−2 V) as the first input signal (IN_H). The second input signal supply line 64*b* supplies the second voltage (+2 V) or the fourth voltage (−6 V) as the second input signal (IN_L). In FIG. 18, the second voltage (+2 V) is supplied as the second input signal (IN_L).

The third selection signal (SEL3) supplied by the third selection signal supply line 64*c* is the first voltage (+6 V) or the third voltage (−2 V) and the second voltage (+2 V) or the fourth voltage (−6 V). In FIG. 18, the third voltage (−2 V) and the second voltage (+2 V) are supplied as the third selection signal (SEL3). Accordingly, the switch 64*d* for the Input switch selects the second input signal (IN_L).

The second voltage (+2 V), which is the second input signal (IN_L) having passed through the first NOT part wire 66*a* and the fifth INV circuit 66*b* of the NOT part 66, becomes the fourth voltage (−6 V) and is supplied to the portion "INN" in FIG. 18. On the other hand, the second voltage (+2 V), which is the second input signal (IN_L) having passed through the second NOT part wire 66*c*, is directly outputted as the second voltage (+2 V) to the portion "INP" in FIG. 18.

The fourth selection signal supply line 67*a* of the Output switch 67 supplies the third voltage (−2 V) and the second voltage (+2 V), which are the third selection signal (SEL3). Accordingly, the switch 67*b* for the Output switch (SW4) selects "INP". The second voltage (+2 V) supplied to "INP" is supplied to the multiplexer 68.

For example, the second voltage (+2 V) is supplied to the BLDRVU line 68*a* of the multiplexer 68. On the other hand, for example, the fourth voltage (−6 V) is supplied to the BLDRV line 68*b*.

A switch 68*c* for the multiplexer 68 is a switch which selects "the lower side in the drawing of FIG. 18 in a case where the logical value is 1" or "the upper side in the drawing of FIG. 18 in a case where the logical value is 0". As seen in FIG. 18, the signal of "+2 V" (the second voltage) supplied to INP is "the signal with the logical value of 1," and the signal of "−6 V" (the fourth voltage) supplied to INN is "the signal with the logical value of 0". Therefore, since the logical value is 1 as seen in FIG. 18, the fourth voltage (−6 V) supplied to the BLDRV line 68*b* is supplied to the bit line BL and used for the operation of the memory cell MC.

Figure 19:
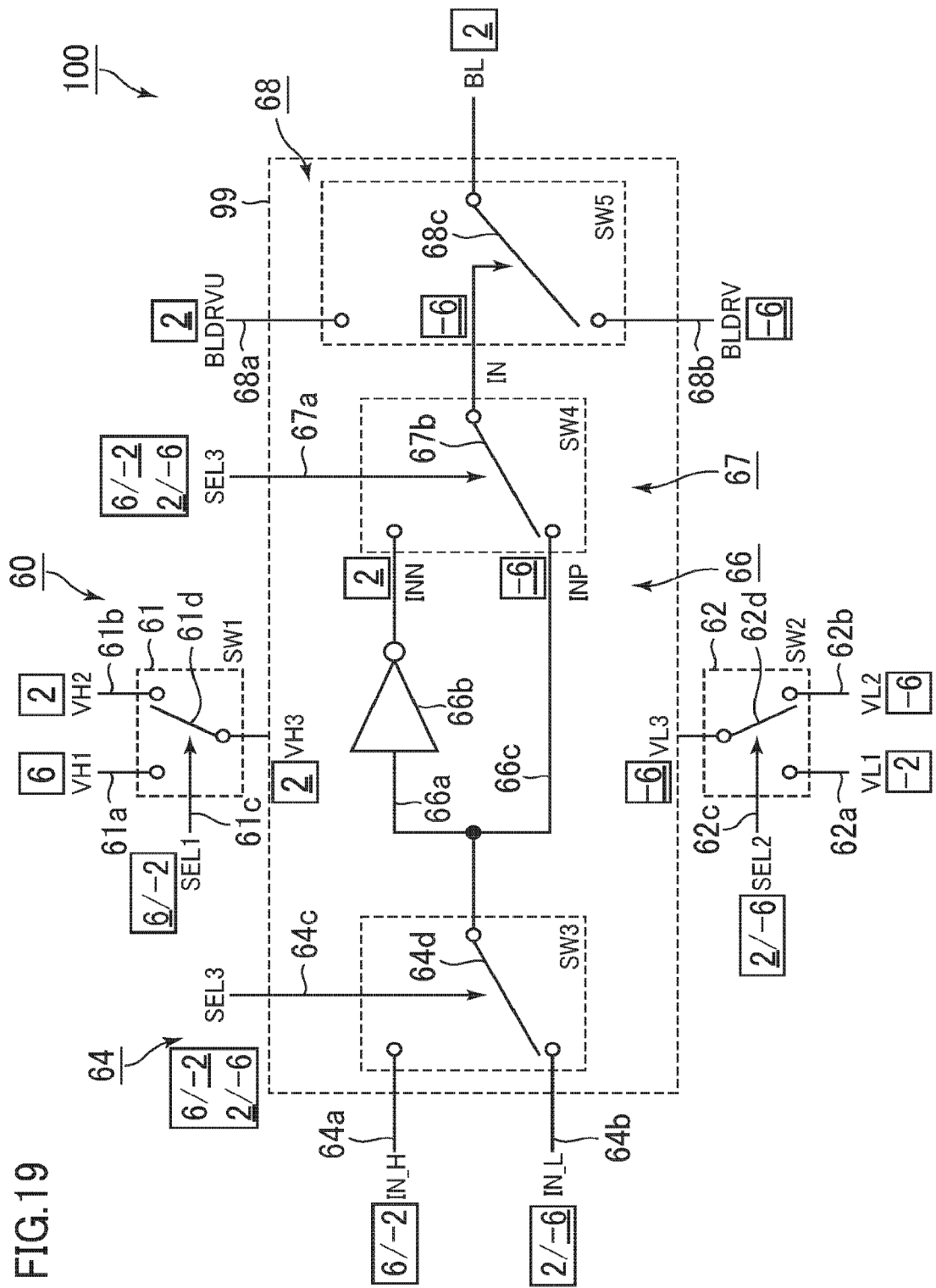
FIG. 19 is one example of the operation in the circuit diagram of the semiconductor device of one aspect of the third embodiment.

Next, description is made using FIG. 19. Unlike the case shown in FIG. 18, the fourth voltage (−6 V) is used as the second input signal (IN_L). Therefore, the fourth voltage (−6 V), which is the second input signal (IN_L) having passed through the first NOT part wire 66*a* and the fifth INV circuit 66*b*, becomes the second voltage (+2 V) and is supplied to the portion "INN" in FIG. 19. On the other hand, the fourth voltage (−6 V), which is the second input signal (IN_L) having passed through the second NOT part wire 66c, is directly outputted as the fourth voltage (−6 V) to the portion "INP" in FIG. 19. Therefore, the fourth voltage (−6 V) is supplied to the multiplexer 68. Since it is recognized that the fourth voltage (−6 V) is "the signal with logical value of 0," the second voltage (+2 V) supplied to the BLDRVU line 68a is supplied to the bit line BL and used for the operation of the memory cell MC.

Figure 20:
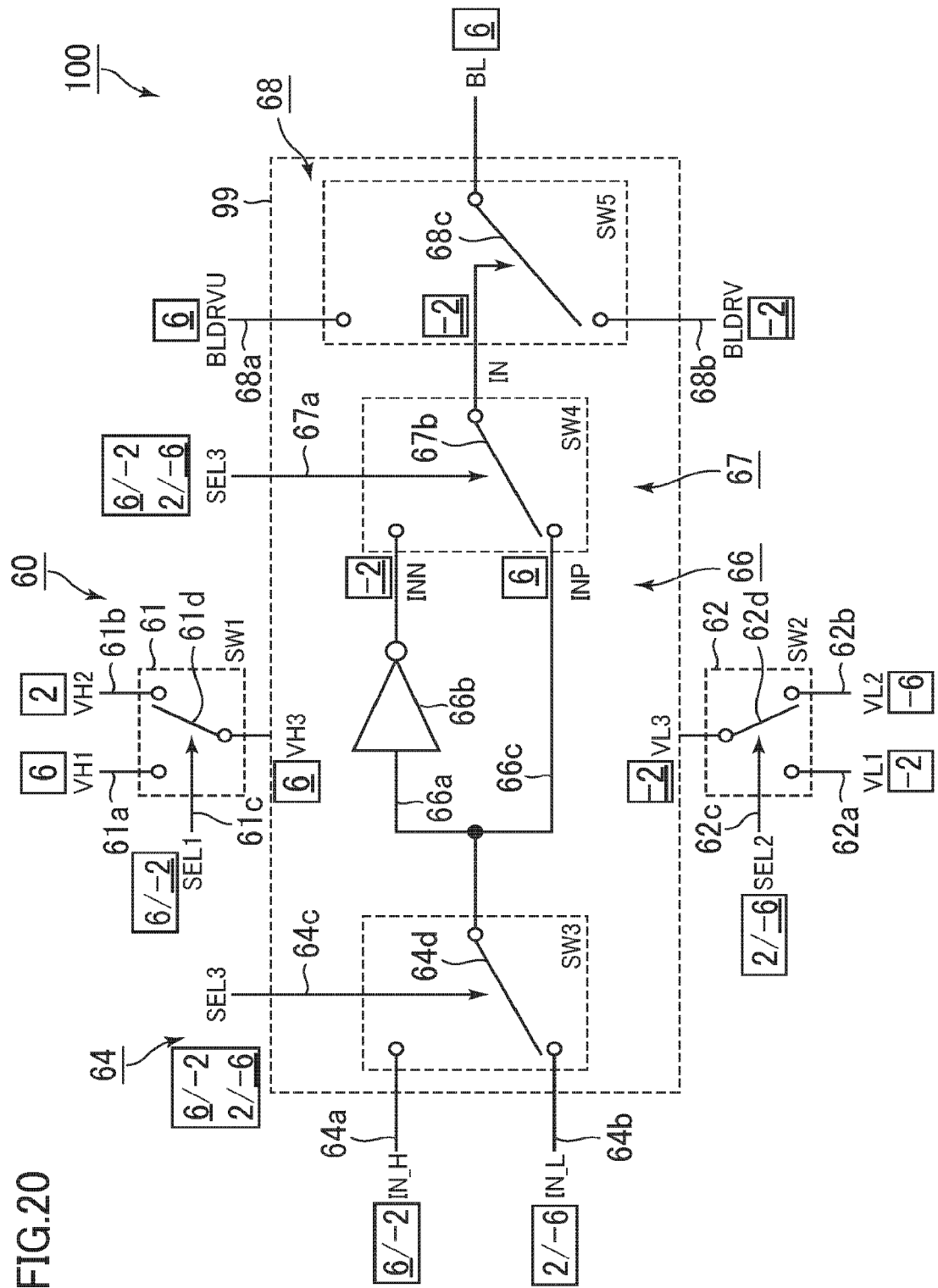
FIG. 20 is one example of the operation in the circuit diagram of the semiconductor device of one aspect of the third embodiment.

Description is made using FIG. 20. In FIG. 20, −2 V is selected as the first selection signal (SEL1). Therefore, a signal of −2 V is supplied by the first selection signal supply line 61c.

By the signal of −2 V supplied from the first selection signal supply line 61c, the switch 61d for the first Well switch selects VH1 (the first voltage, +6 V) from VH1 (the first voltage, +6 V) and VH2 (the second voltage, +2 V). Accordingly, a signal of +6 V is supplied as one operating voltage (VH3) of the operation circuit 99.

Moreover, in FIG. 20, a signal of −6 V is selected as the second selection signal (SEL2). The signal of −6 V is supplied by the second selection signal supply line 62c.

By the signal of −6 V supplied from the second selection signal supply line 62c, the switch 62d for the second Well switch selects VL1 (the third voltage, −2 V) from VL1 (the third voltage, −2 V) and VL2 (the fourth voltage, −6 V). Accordingly, a signal of −2 V is supplied as one operating voltage (VL3) of the operation circuit 99.

A signal of +6 V is supplied as the first input signal (IN_H). And, the first voltage (+6 V) and the fourth voltage (−6 V) are supplied as the third selection signal (SEL3). Accordingly, the switch 64d for the Input switch selects the first input signal (IN_H).

The first voltage (+6 V), which is the first input signal (IN_H) having passed through the first NOT part wire 66a and the fifth INV circuit 66b of the NOT part 66, becomes the third voltage (−2 V) and is supplied to the portion "INN" in FIG. 20. On the other hand, the first voltage (+6 V), which is the first input signal (IN_H) having passed through the second NOT part wire 66c is directly outputted as the first voltage (+6 V) to the portion "INP" in FIG. 20.

The fourth selection signal supply line 67a of the Output switch 67 supplies the first voltage (+6 V) and the fourth voltage (−6 V), which are the third selection signal (SEL3). Accordingly, the switch 67b for the Output switch (SW4) selects "INN". The third voltage (−2 V) supplied to "INN" is supplied to the multiplexer 68.

For example, the first voltage (+6 V) is supplied to the BLDRVU line 68a of the multiplexer 68. On the other hand, for example, the third voltage (−2 V) is supplied to the BLDRV line 68b.

As seen in FIG. 20, the signal of "+6 V" (the first voltage) supplied to INP is "the signal with the logical value of 0," and the signal of "−2 V" (the third voltage) supplied to INN is "the signal with the logical value of 1". Therefore, since the logical value is 1 as seen in FIG. 20, the first voltage (+6 V) supplied to the BLDRVU line 68a is supplied to the bit line BL and used for the operation of the memory cell MC.

Figure 21:
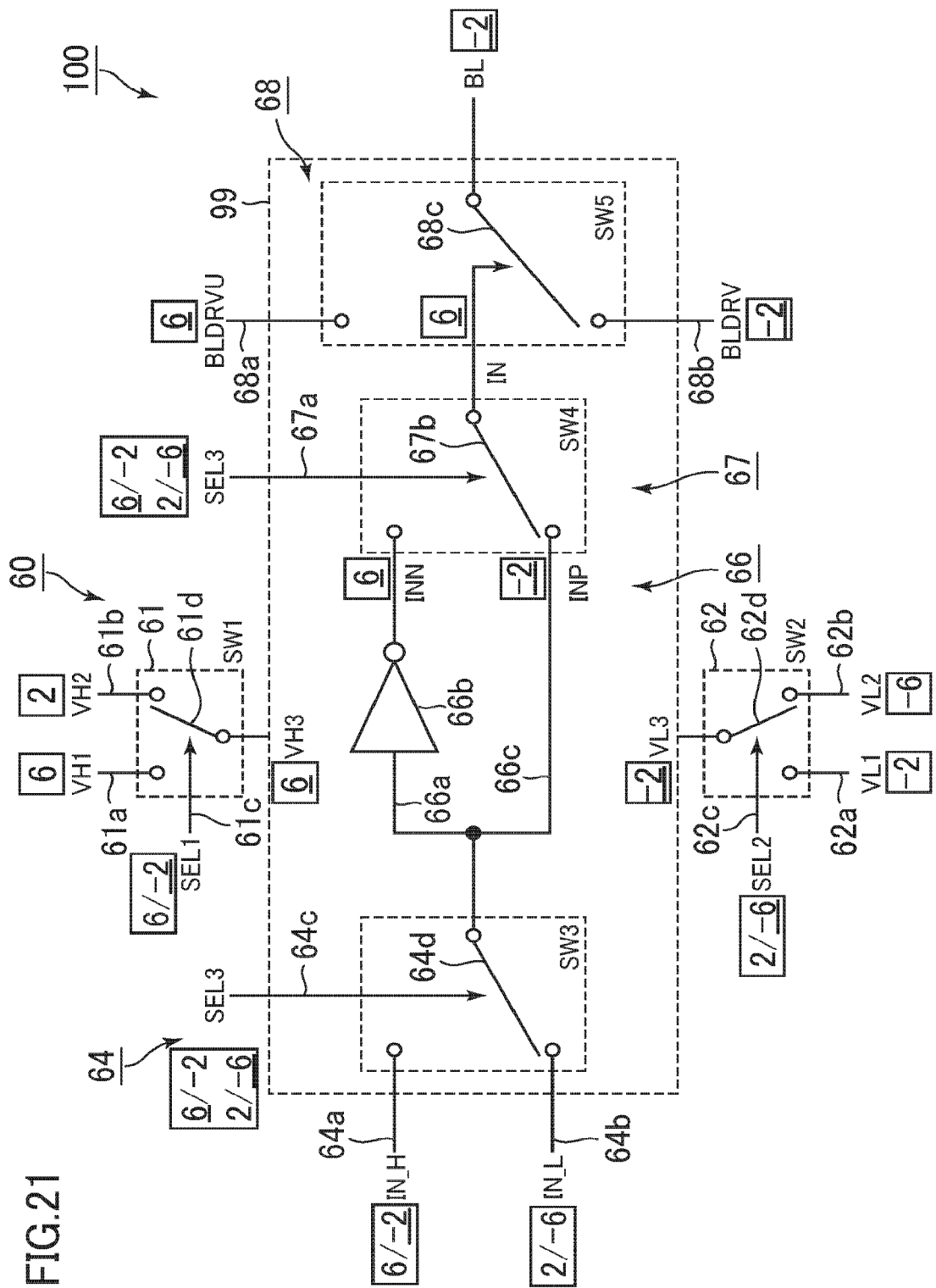
FIG. 21 is one example of the operation in the circuit diagram of the semiconductor device of one aspect of the third embodiment.

Next, description is made using FIG. 21. Unlike the case shown in FIG. 20, the third voltage (−2 V) is used as the first input signal (IN_H). Therefore, the third voltage (−2 V), which is the first input signal (IN_H) having passed through the first NOT part wire 66a and the fifth INV circuit 66b, becomes the first voltage (+6 V) and is supplied to the portion "INN" in FIG. 21. On the other hand, the third voltage (−2 V), which is the first input signal (IN_H) having passed through the second NOT part wire 66c, is directly outputted as the third voltage (−2 V) to the portion "INP" in FIG. 21. Therefore, the first voltage (+6 V) is supplied to the multiplexer 68. Since the first voltage (+6 V) is appreciated as "the signal with logical value of 0," the third voltage (−2 V) supplied to the BLDRV line 68b is supplied to the bit line BL and used for the operation of the memory cell MC.

Figure 22:
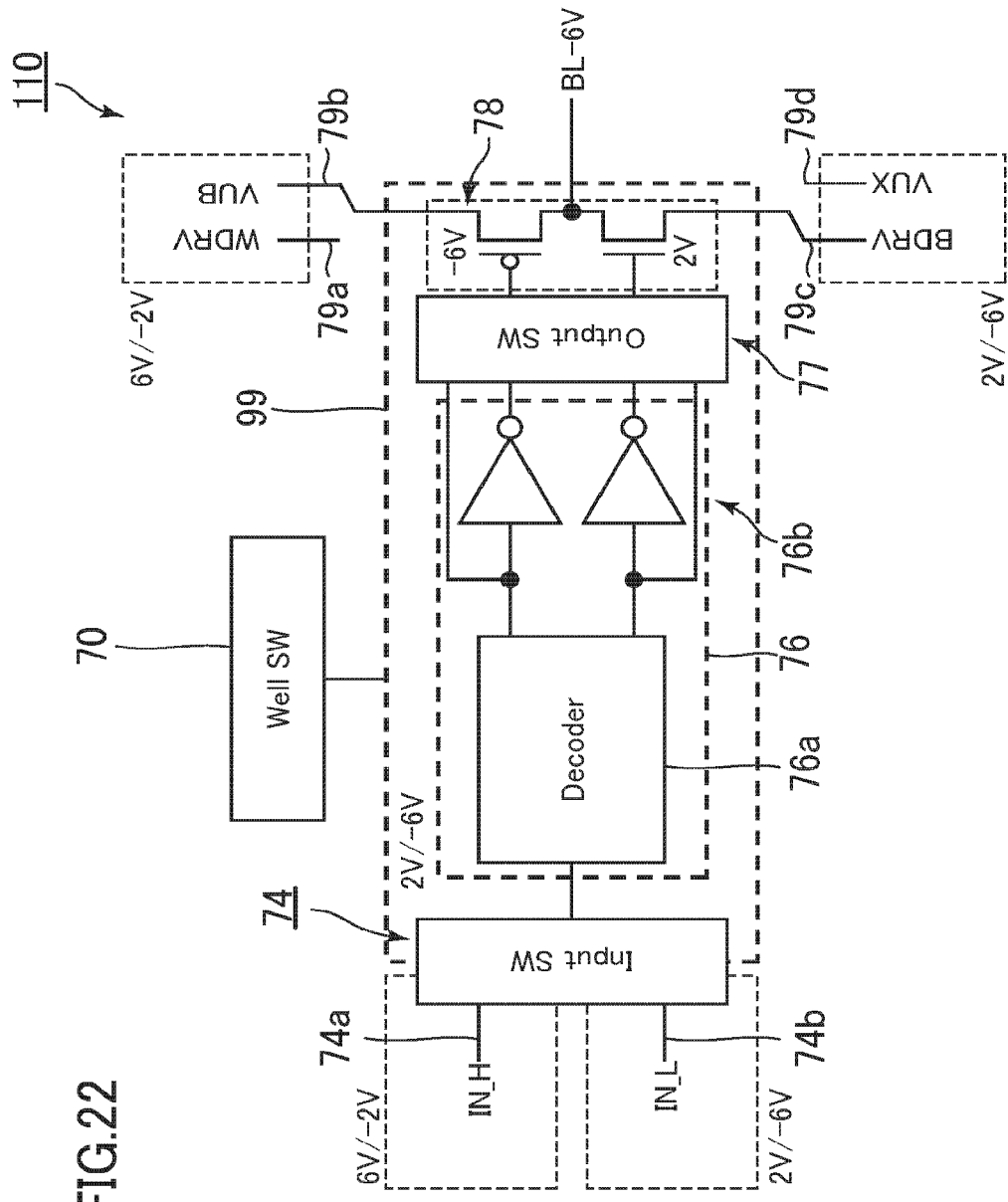
FIG. 22 is a circuit diagram of a semiconductor device of another aspect of the third embodiment.

FIG. 22 is a circuit diagram of a semiconductor device 110 of another aspect of the embodiment. The semiconductor device 110 is one supposed a case where there are a plurality of bit lines BL.

FIGS. 23A to 23C are circuit diagrams of the respective switches used in the semiconductor device according to the embodiment.

The semiconductor device 110 includes a Well switch (first switch) 70, an Input switch (second switch) 74, a decoder unit 76, an Output switch (third switch) 77, and a multiplexer (fourth switch) 78.

The Well switch 70 uses a first selection signal (SEL1) and a second selection signal (SEL2) to select one of a first voltage (+6 V) and a third voltage (−2 V) or a second voltage (+2 V) and a fourth voltage (−6 V) from the first voltage (+6 V), the second voltage (+2 V), the third voltage (−2 V) and the fourth voltage (−6 V) and supplies the voltages to an operation circuit 99. Then, a first selection signal SEL1 is equal to, for example, the first voltage (+6 V) or the third voltage (−2 V), and a second selection signal (SEL2) is equal to, for example, the second voltage (+2 V) or the fourth voltage (−6 V).

In the circuit diagrams of a first Well switch unit 71 and a second Well switch unit 72 shown in FIG. 23A, the first selection signal (Forward/Reverse in FIG. 23A) is supplied to the first Well switch unit 71, and one of the first voltage (+6 V) or the second voltage (+2 V) is selected. Then, the second selection signal (Forward/Reverse in FIG. 23A) is supplied to the second Well switch unit 72, and one of the third voltage (−2 V) or the fourth voltage (−6 V) is selected. Note that the first Well switch unit 71 and the second Well switch unit 72 in FIG. 23A can also be preferably used in the semiconductor device 100 shown in FIGS. 18 to 21.

The Input switch 74 selects one of a first input signal (IN_H) or a second input signal (IN_L). The first input signal (IN_H) is supplied from a first input signal supply line 74a, and the second input signal (IN_L) is supplied from a second input signal supply line 74b. Then, the first input signal (IN_H) is the first voltage or the third voltage, and the second input signal (IN_L) is the second voltage or the fourth voltage.

The Input switch 74 can be realized by, for example, the circuit diagram shown in FIG. 1, 6 or 23B. Note that the Input switch 74 in FIG. 1, 6 or 23B can also be preferably used in the semiconductor device 100 shown in FIGS. 18 to 21.

The decoder unit 76 has a decoder 76a and an INV portion 76b. The decoder 76a shown in FIG. 22 is a general-purpose decoder of a one-input two-output type. Note that the numbers of inputs and outputs of the decoder 76a are not limited to these. When the first voltage (+6 V) is inputted into the decoder 76a from the Input switch 74, the decoder 76a outputs the first voltage (+6 V) and the third voltage (−2 V). On the other hand, when the third voltage (−2 V) is inputted into the decoder 76a from the Input switch 74, the third voltage (−2 V) and the first voltage (+6 V) are outputted.

The voltages outputted from the decoder 76a are inputted into the Output switch 77 via the INV portion 76b. FIG. 23C shows a circuit diagram of the Output switch 77.

A signal outputted by the Output switch 77 is Inputted into the multiplexer 78. The multiplexer 78 is, for example, a p-type MOS transistor and an n-type MOS transistor connected in series as shown in FIG. 22. Accordingly, the first voltage (+6 V), the second voltage (+2 V), the third voltage (−2 V) and the fourth voltage (−6 V) supplied by a WDRV line 79a, a VUB line 79b, a BDRV line 79c and a VUX line 79d can be outputted to a bit line BL as appropriate. Note that the Output switch 77 shown in FIG. 23C can also be preferably used in the semiconductor device 100 shown in FIGS. 18 to 21.

Note that the first selection signal is one example of the second selection signal, the second selection signal is one example of the third selection signal, and the third selection signal is one example of the first selection signal.

Next, the effects of the semiconductor device according to the embodiment will be described.

In a bipolar memory that changes the directions of the voltages applied to the memory cells MC by the operation, a wide range of voltages can be preferably applied to the bit lines BL and the word lines WL.

Even in a unipolar memory in which the directions of the voltages applied to the memory cells MC do not change, a wide range of voltages can also be preferably applied to the word lines WL sandwiched between the adjacent bit lines BL or to the bit lines BL sandwiched between the adjacent word lines WL.

Therefore, it is necessary to design the multiplexer MUX provided at the portion closest to the bit lines BL or the word lines WL so as to be able to cope with a high maximum applied voltage. As a method of designing such a multiplexer, for example, means such as connecting a plurality of transistors in series or thickening the gate length to reduce the voltage applied between the source electrode and the drain electrode can be considered. However, these cases have a problem that the circuit area enlarges because the number of transistors increases. Moreover, there is a problem that it is difficult to reduce the voltage between the body and the drain of the transistor used in the multiplexer MUX, which is provided at the portion closest to the bit lines BL and the word lines WL, or the applied voltage between the gate electrode and the drain electrode.

Figure 24:
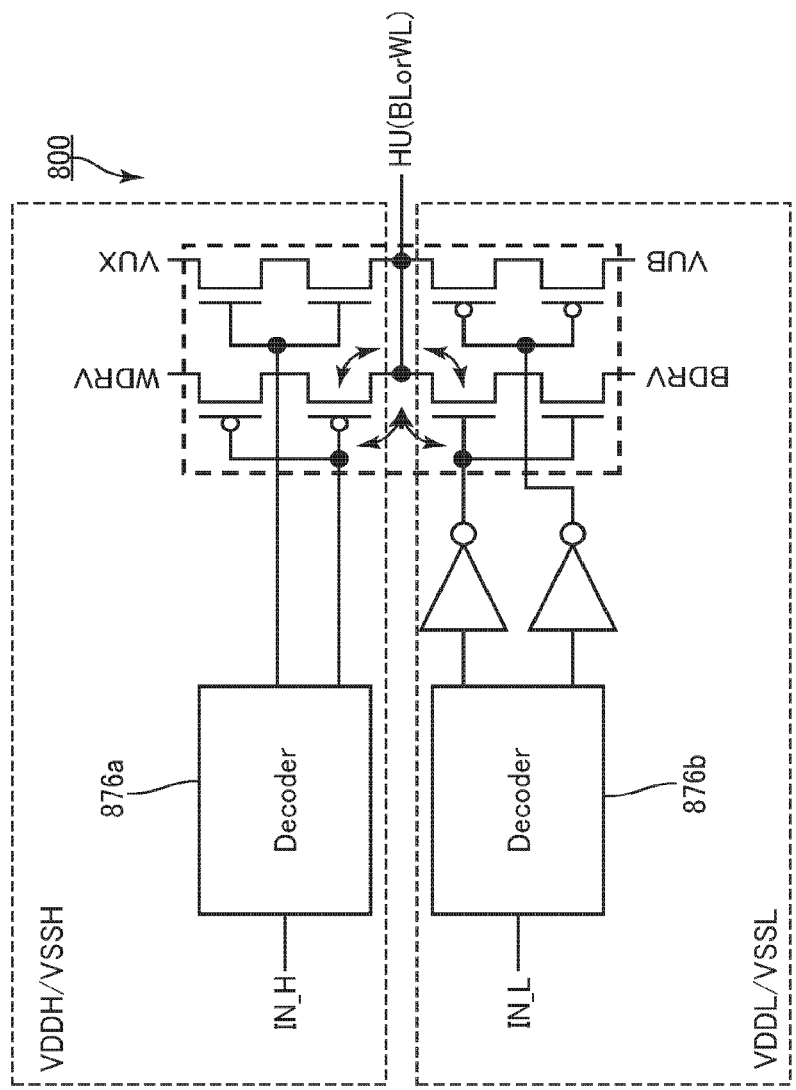
FIG. 24 is a circuit diagram of a semiconductor device according to a comparative embodiment of the third embodiment.

FIG. 24 shows a circuit diagram of a semiconductor device 800 according to a comparative embodiment of the embodiment. The semiconductor device 800 outputs VDDH (one example of a first voltage, +6 V), VSSH (one example of a third voltage, −2 V), VDDL (one example of a second voltage, +2 V) and VSSL (one example of a fourth voltage, −6 V). In this case, as decoders, a decoder 876a for VDDH (one example of the first voltage, +6 V) and VSSH (one example of the third voltage, −2 V) and a decoder 876b for VDDL (one example of the second voltage, +2 V) and VSSL (one example of the fourth voltage, −6 V) are used. Therefore, the occupied area increases. Moreover, eight transistors are used as a multiplexer MUX. Therefore, the occupied area further increases. Furthermore, there is a possibility that 12 V, which is the maximum difference between the first voltage (+6 V) and the fourth voltage (−6 V), is applied between the body and the drain electrode and between the gate electrodes and the drain electrodes, which are of the connected transistors. Therefore, there is a concern that the transistors can withstand the application of such a high voltage.

Using the Well switch, the semiconductor device according to the embodiment selects one of the first voltage (+6 V) and the third voltage (−2 V) or the second voltage (+2 V) and the fourth voltage (−6 V).

Accordingly, the regions (domain) of the voltages at which the transistors operate can be limited between the first voltage (+6 V) and the third voltage (−2 V) or between the second voltage (+2 V) and the fourth voltage (−6 V). Therefore, for example, since the voltage difference is 8 V, the voltage applied to the transistors constituting the multiplexer MUX can be lowered.

Moreover, since the number of transistors and the number of decoders can be reduced, the circuit area can be reduced.

In the semiconductor device according to the embodiment, the voltage is switched by using the Well switch for the entire semiconductor device. Therefore, the semiconductor device is particularly suitable for setting or resetting many memory cells at once.

Figure 25:
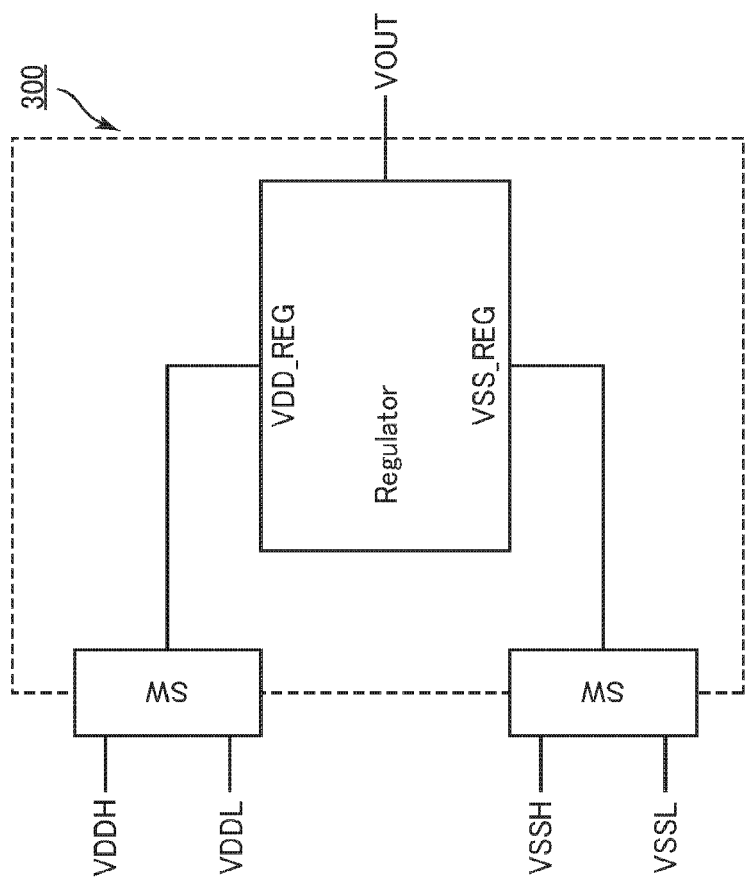
FIG. 25 is a block diagram showing an application example of the semiconductor device (power supply circuit) according to the third embodiment.

FIG. 25 shows a block diagram showing an application example of the semiconductor device according to the embodiment. FIG. 25 shows a power supply 300. A power supply circuit according to the embodiment is preferably used not only to set or reset the memory cells MC but also to supply, for example, a voltage (VOUT) between VDDH and VSSH or between VDDL and VSSL.

While certain embodiments have been described, these embodiments have been presented by way of example only, and are not intended to limit the scope of the inventions. Indeed, a semiconductor switch and a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor switch comprising:
   a first sub-switch; and
   a second sub-switch,
   wherein a first input signal is inputted into the first sub-switch and a second input signal is inputted into the second sub-switch,
   and wherein the first input signal is either a first voltage or a third voltage, the second input signal is either a second voltage or a fourth voltage, the second voltage is lower than the first voltage, the third voltage is lower than the first voltage and the fourth voltage is lower than the third voltage,
   and wherein the second voltage is inputted into the second sub-switch when an output from the first sub-switch is outputted from the semiconductor switch, and the third voltage is inputted into the first sub-switch when an output from the second sub-switch is outputted from the semiconductor switch.

2. The semiconductor switch according to claim 1, wherein
   the first sub-switch comprises a first PMOS transistor and a first NMOS transistor,
   the second sub-switch comprises a second PMOS transistor and a second NMOS transistor, and
   a gate of the first PMOS transistor and a gate of the second NMOS transistor are connected.

3. The semiconductor switch according to claim 2, further comprising:
   a first INV circuit, an output of the first INV circuit being connected to an input of the first sub-switch;
   a first NAND circuit, an output of the first NAND circuit being connected to an input of the first INV circuit and the first NAND circuit having one input and the other input;

a second NAND circuit, an output of the second NAND circuit being connected to an input of the second sub-switch and the second NAND circuit having one input and the other input; and a second INV circuit, an output of the second INV circuit being connected to the one input of the second NAND circuit.

4. The semiconductor switch according to claim 3, wherein the first input signal is inputted into the one input of the first NAND circuit, the third voltage is inputted into the other input of the first NAND circuit, the fourth voltage selected from the second input signal is inputted into an input of the second INV circuit, the second voltage is inputted into the other input of the second NAND circuit, the second voltage is inputted into the gate of the first PMOS transistor and the gate of the second NMOS transistor, the fourth voltage selected from the second voltage, the fourth voltage, the first voltage and the third voltage is inputted into a gate of the first NMOS transistor, a first selection signal is the first voltage or the third voltage, the third voltage selected from the first selection signal is inputted into a gate of the second PMOS transistor, and the output from the second sub-switch is outputted from the semiconductor switch.

5. The semiconductor switch according to claim 3, wherein the first voltage selected from the first input signal is inputted into the one input of the first NAND circuit, the first voltage is inputted into the other input of the first NAND circuit, the second input signal is inputted into an input of the second INV circuit, the fourth voltage is inputted into the other input of the second NAND circuit, the third voltage is inputted into the gate of the first PMOS transistor and the gate of the second NMOS transistor, the second voltage selected from the second voltage, the fourth voltage, the first voltage and the third voltage is inputted into the gate of the first NMOS transistor, a first selection signal is the first voltage or the third voltage, the first voltage selected from the first selection signal is inputted into the gate of the second PMOS transistor, and the output from the first sub-switch is outputted from the semiconductor switch.

6. The semiconductor switch according to claim 2, further comprising:

a first NOR circuit, an output of the first NOR circuit being connected to the input of the first sub-switch, the first NOR circuit having one input and the other input;

a third INV circuit, an output of the third INV circuit being connected to the one input of the first NOR circuit;

a fourth INV circuit, an output of the fourth INV circuit being connected to the input of the second sub-switch; and a second NOR circuit, an output of the second NOR circuit being connected to an input of the fourth INV circuit, the second NOR circuit having one input and the other input.

7. The semiconductor switch according to claim 6, wherein the first input signal is inputted into an input of the third INV circuit, the first voltage is inputted into the other input of the first NOR circuit, the fourth voltage selected from the second input signal is inputted into the one input of the second NOR circuit, the fourth voltage is inputted into the other input of the second NOR circuit, the second voltage is inputted into the gate of the first PMOS transistor and the gate of the second NMOS transistor, the fourth voltage selected from the second voltage, the fourth voltage, the first voltage and the third voltage is inputted into the gate of the first NMOS transistor, a first selection signal is the first voltage or the third voltage, the third voltage selected from the first selection signal is inputted into the gate of the second PMOS transistor, and the output from the second sub-switch is outputted from the semiconductor switch.

8. The semiconductor switch according to claim 6, wherein the first voltage selected from the first input signal is inputted into the input of the third INV circuit, the third voltage is inputted into the other input of the first NOR circuit, the second input signal is inputted into the one input of the second NOR circuit, the second voltage is inputted into the other input of the second NOR circuit, the third voltage is inputted into the gate of the first PMOS transistor and the gate of the second NMOS transistor, the second voltage selected from the second voltage, the fourth voltage, the first voltage and the third voltage is inputted into the gate of the first NMOS transistor, a first selection signal is the first voltage or the third voltage, the first voltage selected from the first selection signal is inputted into the gate of the second PMOS transistor, and the output from the first sub-switch is outputted from the semiconductor switch.

9. The semiconductor switch according to claim 1, wherein the second voltage is higher than the third voltage.

10. A semiconductor device comprising:

a first switch configured to use a second selection signal and a third selection signal to select one of a first voltage and a third voltage or a second voltage and a fourth voltage;

a semiconductor switch according to claim 1 configured to select one of the first input signal or the second input signal;

a second switch configured to output the third voltage when the first voltage and the third voltage are selected by the first switch and the first input signal, which is the first voltage, is selected by the semiconductor switch, to output the first voltage when the first voltage and the third voltage are selected by the first switch and the first input signal, which is the third voltage, is selected by the semiconductor switch, to output the second voltage when the second voltage and the fourth voltage are selected by the first switch and the second input signal, which is the second voltage, is selected by the semiconductor switch, and to output the fourth voltage when the second voltage and the fourth voltage are selected by the first switch and the second input signal, which is the fourth voltage, is selected by the semiconductor switch;

a third switch configured to output the first voltage when the third voltage is outputted from the second switch, to output the third voltage when the first voltage is outputted from the second switch, to output the fourth voltage when the second voltage is outputted from the second switch, and to output the second voltage when the fourth voltage is outputted from the second switch; and a control circuit configured to control the first switch, the semiconductor switch, the second switch and the third switch.

11. The semiconductor device according to claim 10, wherein a p-type MOS transistor and an n-type MOS transistor are connected in series in the third switch.

12. The semiconductor device according to claim 10, wherein the first switch comprises:

a first Well switch configured to use the second selection signal to supply the first voltage or the second voltage from the first voltage and the second voltage; and a second Well switch configured to use the third selection signal to supply the third voltage or the fourth voltage from the third voltage and the fourth voltage.

13. The semiconductor device according to claim 10, wherein the first switch supplies a voltage for operating the semiconductor switch, the second switch and the third switch.

14. The semiconductor device according to claim 10, further comprising a decoder unit, wherein the decoder unit supplies the first voltage and the third voltage to the second switch when the first voltage or the third voltage is inputted from the semiconductor switch, and supplies the second voltage and the fourth voltage to the second switch when the second voltage or the fourth voltage is inputted from the semiconductor switch.

* * * * *